United States Patent

Maeda

[11] Patent Number: 6,043,859
[45] Date of Patent: Mar. 28, 2000

[54] ACTIVE MATRIX BASE WITH RELIABLE TERMINAL CONNECTION FOR LIQUID CRYSTAL DISPLAY DEVICE

[75] Inventor: Akitoshi Maeda, Tokyo, Japan

[73] Assignee: NEC Corporation, Tokyo, Japan

[21] Appl. No.: 08/978,647

[22] Filed: Nov. 26, 1997

[30] Foreign Application Priority Data

Nov. 28, 1996 [JP] Japan ................................ 8-317593

[51] Int. Cl.[7] ..................... G02F 1/1343; G02F 1/136; H01L 23/48
[52] U.S. Cl. ..................... 349/143; 349/139; 349/42; 349/43; 257/761; 257/763
[58] Field of Search .................... 349/139, 143, 349/42, 43; 257/761, 763

[56] References Cited

U.S. PATENT DOCUMENTS

| | | | |
|---|---|---|---|
| 5,148,248 | 9/1992 | Possin et al. | 357/23.7 |
| 5,264,728 | 11/1993 | Ikeda et al. | 257/761 |
| 5,296,653 | 3/1994 | Kiyota et al. | 174/250 |
| 5,316,975 | 5/1994 | Maeda | 437/195 |
| 5,428,250 | 6/1995 | Ikeda et al. | 257/761 |
| 5,686,328 | 11/1997 | Zhang et al. | 437/41 |
| 5,821,622 | 10/1998 | Tsuji et al. | 257/763 |
| 5,886,761 | 3/1999 | Sasaki et al. | 349/122 |

FOREIGN PATENT DOCUMENTS

| | | |
|---|---|---|
| 6-230400 | 8/1994 | Japan. |
| 7-120789 | 5/1995 | Japan. |
| 8-248442 | 9/1996 | Japan. |

*Primary Examiner*—William L. Sikes
*Assistant Examiner*—Tarifur Chowdhury
*Attorney, Agent, or Firm*—Young & Thompson

[57] ABSTRACT

An active matrix base presented can be readily manufactured using existing fabrication technologies, and driven by either sequential-stagger TFT or reverse-stagger TFT. The bonded interface of the matrix base has low values of electrical resistance in the terminal sections, and maintains stable resistance even after being exposed to high temperature, high humidity conditions. These results are obtained because the component materials are chosen to prevent surface oxidation at the connecting electrodes. The connecting terminals for contact with the drive circuit is made of a nitride film of a high melting point metal or a high electrical conductivity metal, at least in the interface region with the tape carrier package. The metal which can be used includes chrome, tantalum, niobium, titanium, molybdenum and tungsten, or its alloy made mostly from the element, and the high electrical conductivity metal includes aluminum or an alloy of mostly aluminum.

12 Claims, 22 Drawing Sheets

ACTIVE MATRIX BASE WITH RELIABLE TERMINAL CONNECTION FOR LIQUID CRYSTAL DISPLAY DEVICE

BACKGROUND OF THE INVENTION

1. Field of the Invention

The present invention relates in general to liquid crystal display devices based on active matrix base, and relates in particular to a structural configuration of the terminal electrodes in the active matrix base.

2. Description of the Related Art

In recent years, liquid crystal display devices have become widely popular because they are thin and light weight, and particular interests are focused on those liquid crystal display devices based on active matrix bases in which each pixel is driven by its own signal switching element. Their attraction is due to their excellent tonal capability and superior response speed, making these display devices attractive for dynamic imaging applications. Switching elements are usually driven by thin film transistor (TFT) or multiple instruction matrix (MIM) elements.

FIG. 22 is a schematic diagram of a TFT-driven active matrix liquid crystal (LC) display device. On a transparent base 100, a plurality of scanning lines 101 and signals lines 102 intersect each other, and a TFT element 105 is fabricated at each intersection. A TFT element is a three-terminal device comprised of three electrodes for each of a semiconductor layer for performing switching operations, a gate terminal and a source/drain terminal. Each TFT element 105 is connected to one pixel electrode 106, and such pairs are distributed in a matrix pattern on the base 100. For the purpose of connecting the base 100 to external drive circuits, the start terminal (one side) of the scanning line 101 is connected to a scanning line terminal 103; while the start terminal (one side) of the signal line 102 is connected to a signal line terminal 104. The external drive circuits are press bonded to the base plate 100 by placing an anisotropic conductive film (ACF) in the middle, between the terminal surfaces and a tape carrier package (TCP), and pressing together the entire base assembly.

The operation of the active matrix display will be explained briefly. When a voltage pulse is applied to a selected terminal Xi, for example, of the scanning lines 101, the gate voltage becomes higher than the threshold voltage, and all the gates in all the TFT 105 connected to this terminal are simultaneously turned on, and signal voltages of the image data are transmitted by each signal line 104 through the one set of source/drain terminals of the live-TFT 105 to the other set of source/drain terminals of the TFT 105 of the opposing base. The other set of source/drain terminals are connected to the pixel electrodes 106 so that the voltage signals are applied to the pixel electrodes 106, thereby generating a voltage difference between the pixel electrodes 106 (with an intervening LC layer 107) and the opposing electrode 108 formed on the opposing base. The LC layer 107 surrounded by the two bases alters its transparency due to the difference in the voltage impressed on two bases, thereby producing an image corresponding to the signal voltage. When the terminal Xi is in a non-selected state, and when the gate voltage drops below the threshold voltage, all the gates connected to these TFT 105 are turned off, and when a next terminal Xi+1 is selected, all the gates of the TFT 105 connected to this line are turned on, and the above process is repeated. The image does not disappear instantly when the gate voltages are turned off, because the voltage difference applied to the LC layer 107, between the pixel electrodes 106 and the opposing electrodes 108, is maintained primarily due to the static capacitance of the two electrodes until the same scanning line is selected again, and new image signal voltages are applied.

In active matrix bases using amorphous silicon (a-silicon) for the semiconductor layer to fabricate TFT or MIM elements, connecting electrodes to the external drive circuits are made on the scanning line terminals 103 and signal line terminals 104 in the start terminals of each scanning line, and they are operated as discussed above in the case of the TFT technology. Typical requirements for connecting electrodes are that: the contact electrical resistance is low and stable, the joint has high reliability for water resistance and the base can withstand repeat of press bonding operations.

For example, a Japanese Patent Application, First Publication, H1-205460 (referred to as Reference 1) discloses a general type of terminal construction, and a method of making peel-resistant terminals on thin film arrayed transistor base. FIG. 23 in Reference 1 shows a cross sectional view of a first example of an electrical conductive layer of a terminal section comprising a metal film and a transparent conductive overlay. The scanning line terminal 103a of the scanning line 101a on a transparent base 1 is configured in such a way that a metal film 202 (made at the same time as the signal lines) contact the start terminals of the scanning lines 101a through a contact hole 12 fabricated on the gate insulation film 201, and a transparent conductive film 203 is overlaid on the metal film 202. A variation of the structure is disclosed is a channel protection type TFT including an n-type a-silicon layer beneath the metal film 202.

FIG. 24 shows a cross sectional view of a second example in which a terminal configuration comprises a single layer of transparent conductive film 203 in the electrical conduction layer. The second example does not have the metal film 202 used in the first example, and the scanning line terminal 103b is formed on a single layer of the transparent conductive layer 203 connected to the start terminal of the scanning line 101a.

FIG. 25 is a cross sectional view of a third example of the scanning line terminal configuration comprising a single layer of metal film. In this example, contrary to the first example, there is no transparent conductive film 203, so that the scanning line terminal 103c is comprised by a metal film 202 alone overlaying the start terminal of the scanning line 101a.

The advantages of the method for making such TFT array bases for the channel protection type TFT are as follows. These structures can be produced by first depositing the gate insulation film 201 on the entire surface of the base, then a-silicon layer 204 is deposited selectively, using a metal masking, so as to avoid depositing on the start terminals of the scanning line 101a; in patterning the protective insulation film 205, contact holes 12 can be formed by opening the gate insulation film 201 simultaneously in those regions where the scanning lines 101a are not overlaid with a-silicon film 204; and the conductive layer to serve the function of the contact terminal of the scanning line 101a can be formed simultaneously with source/drain electrodes or signal lines. By following such steps, it is possible to protect, without increasing fabrication steps, the surface of the transparent plate 1 in the vicinity of the terminals of the scanning lines 101 on the transparent base 1 from corrosion during wet etching by such etchant as buffered hydrofluoric acid solution, thereby preventing peeling of the terminals.

However, in this approach, because of the use of metal masking, there are problems of damaging the base and generation of debris particles, as well as non-uniform distribution of film thickness. Furthermore, to improve the transistor performance by maintaining a clean interface between the gate insulation film 201 and a-silicon film 204, it is necessary to carry out both deposition steps serially in the same vacuum atmosphere. However, it is generally not possible to use a metal masking only during the latter deposition step, and even if it can be so arranged, it would necessitate a large scale revisions of the deposition apparatus. Also, the metal film may be made of titanium, but when using metals such as molybdenum and tungsten which are corroded by moisture, there is a serious problem that, even if the metal film 202 is protected with the transparent conductive film 203 (refer to FIG. 23), it is generally not possible to assure reliability of the terminal contact. This problem is the same for the terminal structure shown in FIG. 24 when molybdenum or tungsten is used for the scanning line 101a. This problem is made even more serious in the case of single layer structure of the metal film 202 shown in FIG. 25. Additional problem of the structure in FIG. 25 is that the surface of the metal film 202 is oxidized in the subsequent heat treatment processes (annealing in array fabrication and orientation film sintering in cell fabrication), leading to high initial electrical contact resistance and inferior contact reliability.

Another type of contact structure has been disclosed in a Japanese Patent Application, First Publication, H2-156226 (referred to as Reference 2). In this case, as shown in FIGS. 26A, 26B, both the scanning line terminal 103b and signal line terminal 104b are made of a single layer of transparent conductive film 203-1, 203-2, respectively. This technique is based on the use of low resistance conductive materials (aluminum or molybdenum) for the scanning line 101b and signal line 102b, and is excellent from the standpoint of preventing corrosion and oxidation of the terminal sections. However, there is a problem of the ability of the bonded interface to withstand repeated press bonding.

Technique for preventing oxidation of the metal lines is disclosed, for example, in a Japanese Patent Application, First Publication, H4-364723 (referred to as reference 3). A cross sectional view of an electrode structure of this semiconductor device is shown in FIG. 27. The wiring structure comprises a metal film 244, having a high melting point, is surrounded with nitride films 245, 246 of the metal. This structure is fabricated by: making contact hole 243 on the INSULATION film 242 produced on a semiconductor base 241; depositing, successively, a high melting point metal-nitride film 245 and a high melting point metal film 244 by reactive sputtering; producing wiring patterns by etching back the high melting point metal film 244; and forming a high melting point metal-nitride film 246 over the high melting point metal film 244. The high melting point metal nitride serves as a barrier film, and prevents interlayer reaction between silicon and metal layers at the contact interface, and also enables to prevent oxidation of the wiring during high temperature heat treatment processes. The use of nitride films of high melting point metals, such as silicon nitride, for preventing interlayer reaction between silicon in diffusion layer and metal electrode, is widely utilized in semiconductor device fabrication, and is disclosed, for example, in a Japanese Patent Application, First Publication H2-249264.

In reviewing the problems inherent in the existing technologies, it has been considered that the greatest concerns are: in manufacturing active matrix bases, heat treatment steps introduce oxidation of the conductive surface of the contact electrodes leading to high and unstable contact electrical resistance at the terminals, and that even in cases without such problems, there is a degradation in contact reliability. These problems will be discussed in more detail in the following.

In the third example from the first reference presented in FIG. 25, the first concern is oxidation in the metal film 202 caused by the heat treatment steps (annealing in array fabrication and orientation film sintering in cell fabrication), because it leads to high and unstable initial values of electrical contact resistance (press bonded resistance) to TCP. Also, even if the initial contact resistant is low, storage at high temperature and humidity conditions will lead to high electrical contact resistance. The reason is that, although heat treatment is normally carried out in a nitrogen atmosphere, cooling from heat treatment temperature is carried out sometimes while the substrate temperature is high, and when such a base is exposed to air, a low-conductivity oxide film, which behaves like a semiconductor, is formed on the surface of the metal film 202. The second concern is that when the metal film 202 is made of a low corrosion resistant metals, such as molybdenum and tungsten or their alloys, the contact reliability of the terminals cannot be assured. The reason is that even if the metal parts are protected with an ACF during press bonding and the bonded TCP is covered with a polymer resin, it is not possible to completely protect the metal from infiltration of external moisture.

In the first and second examples shown in FIGS. 23 and 24, the first concern is that, if the thickness of the transparent conductive film 203 is of the order of 100 nm, and when the metal film 202 and scanning lines 101a are made of such corrosion-susceptible metals as molybdenum and tungsten, the reliability of the terminal contact cannot be assured. The reason is that because the transparent conductive film 203 is porous, infiltration of external moisture cannot be prevented. The discussion relating to these examples are based on the assumption of reverse-stagger type (channel protection type) TFT, so the transparent conductive film 203 can be made after the fabrication of scanning lines 101a and signal lines, resulting that the structures shown in FIGS. 23, 24 can be made, without increasing the fabrication steps, and there is no problem of surface oxidation. However, when relating to sequential-stagger type TFT, fabrication of transparent conductive film used for source/drain electrodes is normally required to be carried out before fabricating the scanning line (uppermost layer wiring), and therefore, it is necessary to increase the fabrication steps to produce the structures shown in FIGS. 23 and 24. In other words, the second concern is that to make a terminal structure such as those shown in FIGS. 23 and 24 for a sequential-stagger type TFT, fabrication process normally requires more steps. Such production conditions can easily lead to a poor yield, because the sequential-stagger type TFT uses transparent conductive film at least on some regions of the device, leading to a danger of debris particle generation during the transparent film deposition process.

The first concern regarding the technology presented in Reference 1 (JPA, H1-205460) is, during the use of metal masking, the base may become scratched and particles may be generated, because it is necessary for the mask to be laid in contact with the base to prevent deposits to form around to the back of the masking. The second concern is that non-uniform distribution of film thickness can occur during fabrication with a mask, because a mask must have a certain thickness, and deposit formation near the edges of the mask is affected by a shadowing effect of the mask. As the deposition process is continued, deposit can also accumulate on the mask, the shadowed portion also increases gradually. The third concern is that it is difficult to maintain cleanliness in the interface between the gate INSULATION film 201 and the a-silicon film 204 while they are being deposited serially in the same vacuum environment. The result is a degradation in the properties of the fabricated transistors, because it is normally impossible to use metal masking only during the deposition of the latter film, and even if it was possible, it requires a substantial revision of the deposition apparatus.

In the technology presented in Reference 2 (JPA H2-156226), main concern is that it is difficult to repeat press bonding operations, because when the TCP is peeled off for repeating a press bonding step, the transparent conductive films 203-1 and 203-2 are prone to peeling or otherwise damaged, leading to poor yield and poor reliability.

In the technology presented in Reference 3 (JPA, H4-364723), the first concern is that the metal wiring film is susceptible to peeling, because, particularly in the case of high melting point metal, tungsten film, bonding between the nitride film 245 of the high melting point metal and its substrate material is often inadequate. The second concern is that the fabrication process is complex, because the high temperature melting point metal film 244 must be surrounded on both sides with nitride films 245, 246 of the same high temperature melting point metal. Bonding of nitride film 246 of this high temperature melting point metal requires a special technique, called high pressure nitriding.

SUMMARY OF THE INVENTION

It is an object of the present invention to provide an active matrix base which can be manufactured readily by existing fabrication technologies to produce a base having low electrical resistance in the terminal section of the press bonded interface with the tape carrier package, and offer high reliability of electrical contact even after being exposed to high temperature, high humidity conditions.

The object has been achieved in an active matrix base comprising: a plurality of scanning lines arranged in parallel on a transparent base plate; a plurality of signal lines arranged in parallel at right angles to the parallel scanning lines; switching elements fabricated at intersection points of the scanning lines with the signal lines; pixel electrodes operatively connected with the switching elements; and a connecting electrode fabricated at a start terminal of each of the scanning lines and the signal lines; wherein the connecting electrode comprises a metal film operatively connected to the start terminal and a nitride film of a metal, selected from the group consisting of a high-melting-point metal and a high-electrical-conductivity metal, formed on the metal film.

The object can be achieved also in an active matrix base comprising: a plurality of signal lines arranged in parallel on a transparent base plate; a plurality of switching elements fabricated on each of the plurality of scanning lines; a pixel electrode operatively connected to each of the plurality of switching elements; and a connecting electrode fabricated at a start terminal of each of the scanning lines and the signal lines; wherein the connecting electrode comprises a metal film operatively connected to the start terminal and a nitride film of a metal, selected from the group consisting of a high-melting-point metal and a high-electrical-conductivity metal, formed on the metal film.

The metal film on the contact electrodes at least may be overlayed selectively with an electrical INSULATION film having terminal contact holes.

The nitride film may be overlaid on an outer surface and lateral surfaces of a structure comprised of the metal film.

The nitride film may be overlaid on the metal film by self-aligning in the terminal contact holes.

The high melting point metal may be selected from the group consisting of chromium, tantalum, niobium, titanium, molybdenum, and tungsten elements and an alloy comprised substantially of chromium, tantalum, niobium, titanium, molybdenum, and tungsten elements, and the metal of having a high electrical conductivity may be selected from the group consisting of aluminum element and an alloy comprised substantially of aluminum element.

The advantages of the structural configurations provided in the active matrix base of the present invention are related to improvements in the properties of the terminal materials. A nitride film of a high-melting-point metal or a high-electrical-conductivity metal is provided at least at the interface between the contact terminal of the signal lines and the TCP. In such a structure, bearing in mind that scanning lines are also a type of signal lines for transmitting scanning signals, the following advantages are gained.

First, the initial electrical resistance of the contact terminals is reduced and stabilized so that contact reliability is improved. The reason is that the nitride film provided at least on the TCP interface, enables the prevention oxidation of the terminal surface during subsequent heat treatments.

Second, even if the metal used for connecting terminals is a metal susceptible to corrosion, such as molybdenum, tungsten or their alloys, it is possible to assure contact reliability. The reason is that the nitride film of such metals has superior corrosion resistance, and furthermore, by increasing the film thickness, it is possible to block infiltration of external moisture.

Third, the structures presented can be produced without sacrificing the product yield and with a minimal increase in the number of fabrication steps. The reason is that fabrication of transparent film circuits, which often cause problems of debris particle generation, need not be increased in the case of sequential-stagger TFT, and that, by choosing the same metal or its alloy for making a metal nitride film or a metal film, the steps for fabrication and etching can both be carried out in-situ (i.e., using the same CVD apparatus). Because these materials generally provide excellent bonding between the metal film and the underlayer so that peeling is prevented, and repeat of press bonding operation is facilitated. Also, the method avoids the necessity of forming a metal nitride film for underlayer which frequently induces inferior bonding.

DESCRIPTION OF THE PREFERRED EMBODIMENTS

Figure 1:
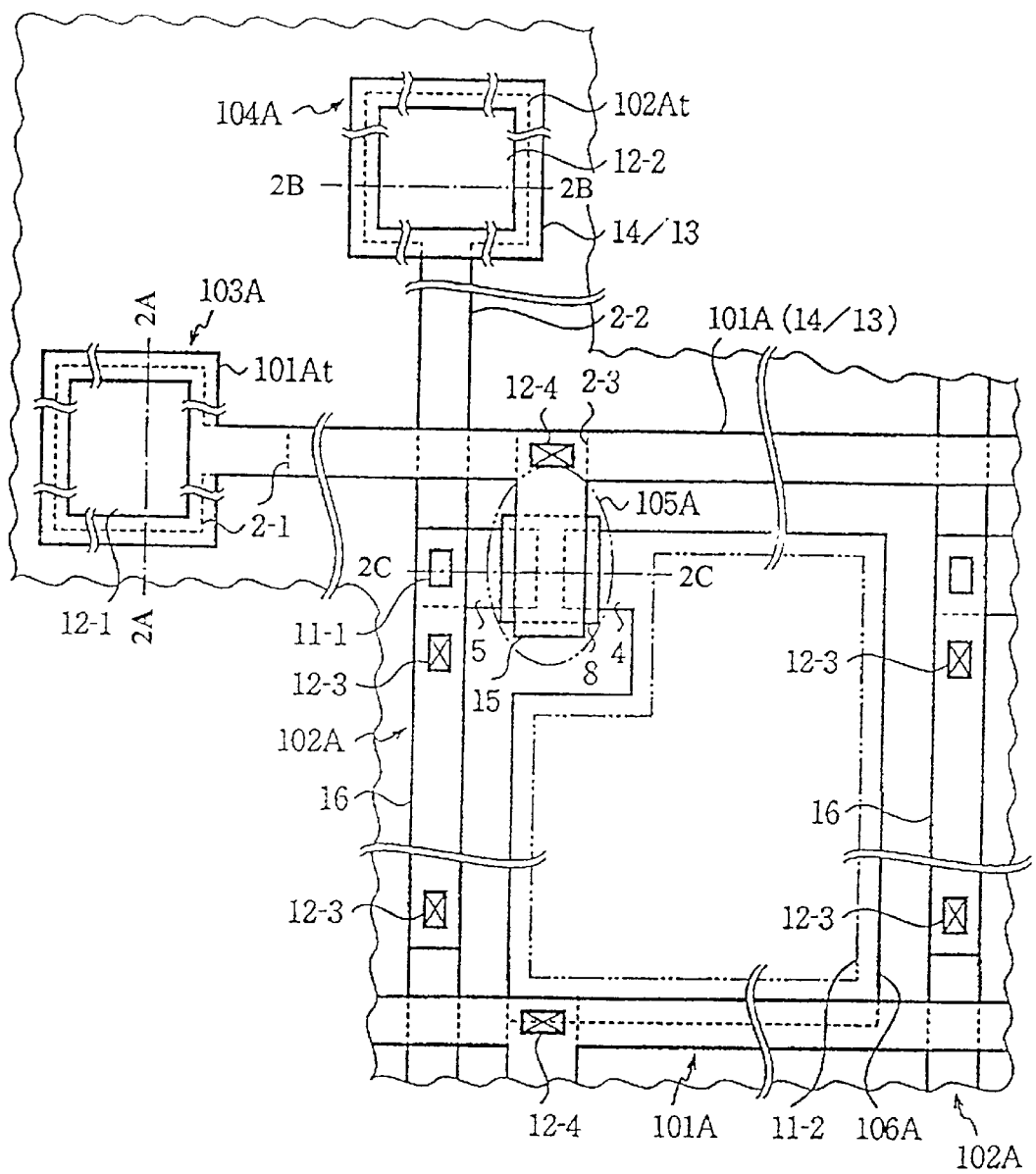
FIG. 1 is a plan view of one side of a TFT panel of Embodiment 1 to show the arrangement of the pixels.
Figure 2A:
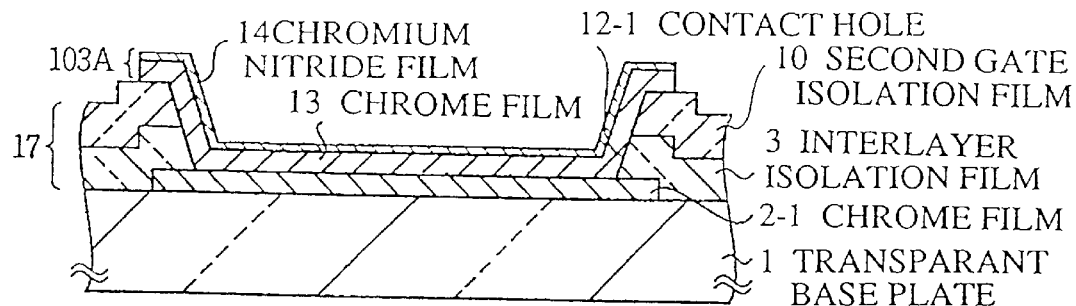
FIGS. 2A, 2B and 2C are enlarged cross sectional views of the device seen at planes A—A, B—B and C—C, respectively, in FIG. 1.
Figure 2B:
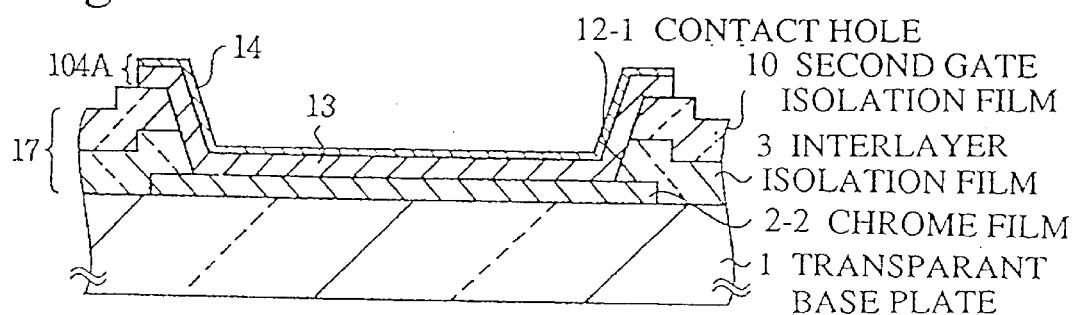
Figure 2C:
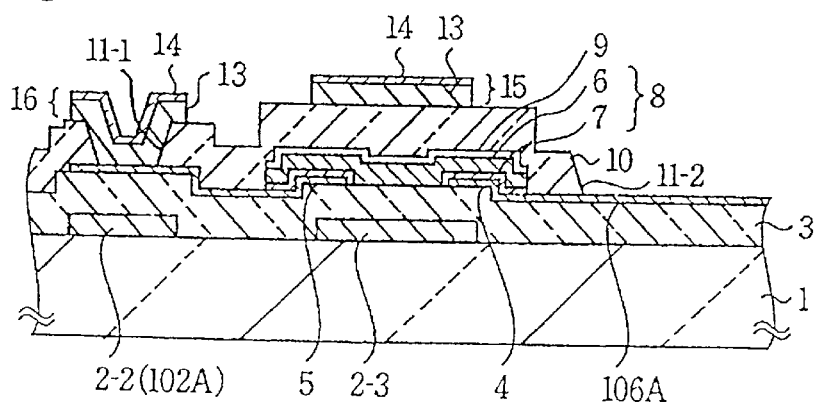
Figure 22:
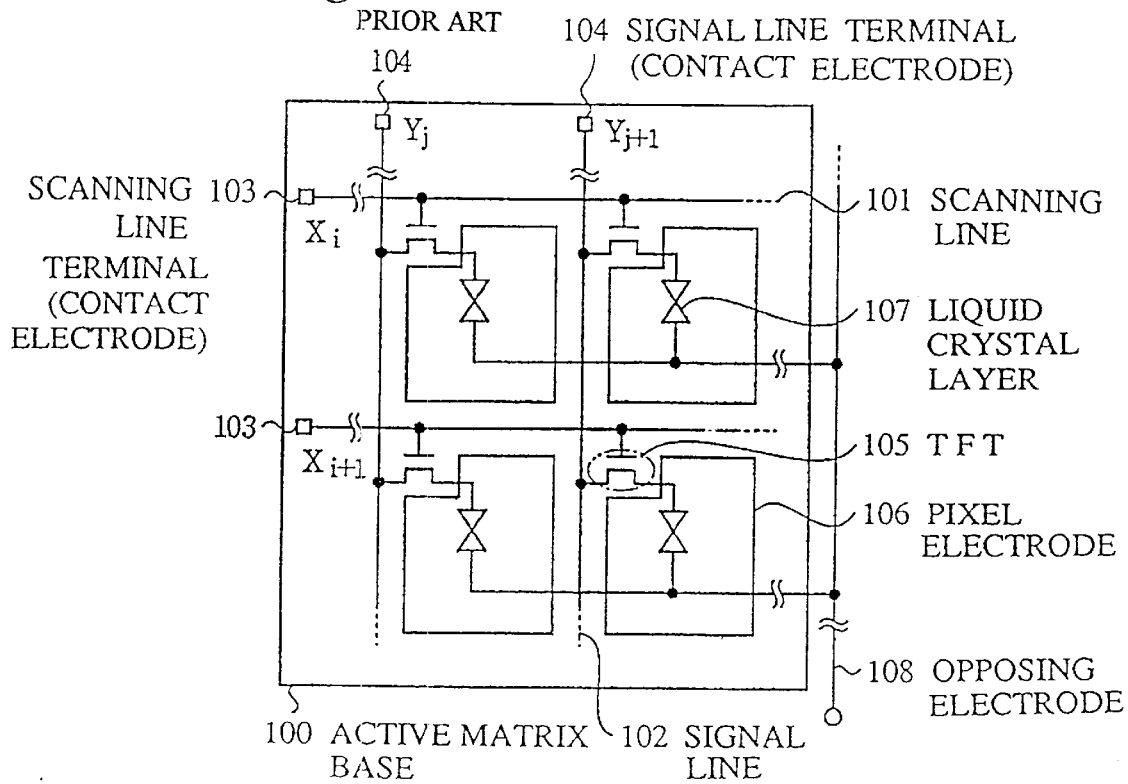
FIG. 22 is a schematic drawing to show a TFT-driven active matrix type liquid crystal display panel.
Figure 23:
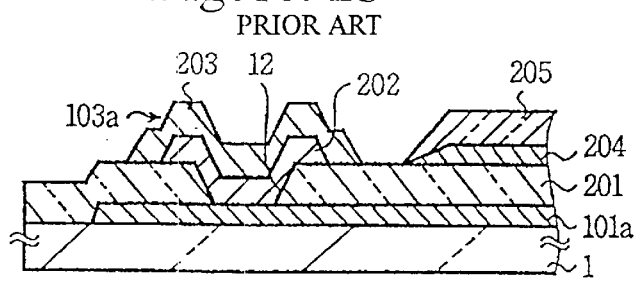
FIG. 23 is a cross sectional view of a conventional structure presented in Example 1 in Reference 1.
Figure 24:
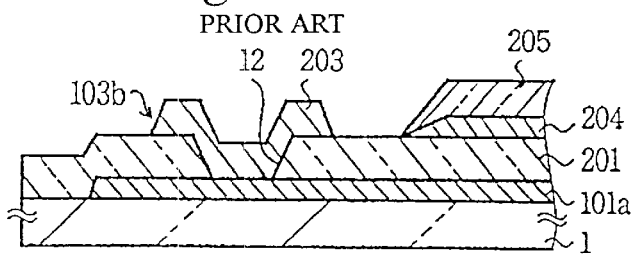
FIG. 24 is a cross sectional view of a conventional structure presented in Example 2, in Reference 1.
Figure 25:
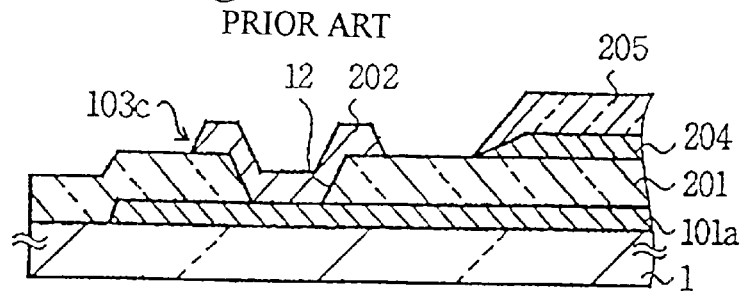
FIG. 25 is a cross sectional view of a conventional structure presented in Example 3, in Reference 1.
Figure 26A:
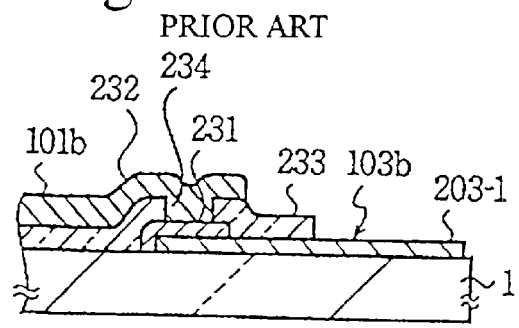
FIG. 26A, 26B are, respectively, cross sectional views of a conventional scanning terminal and signal terminal presented in Reference 2.
Figure 26B:
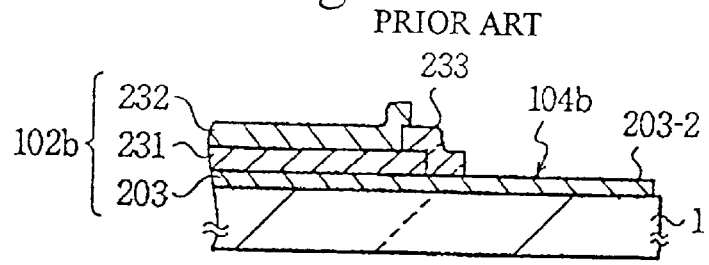
Figure 27:
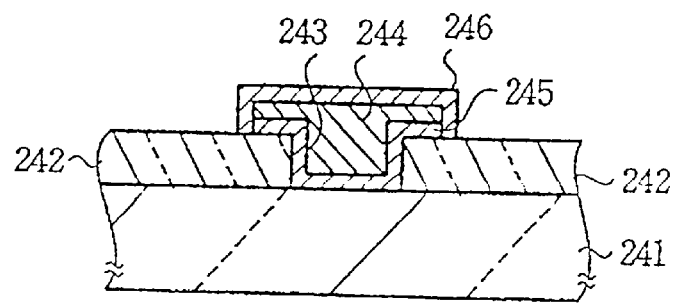
FIG. 27 is a cross sectional view of a conventional device presented in Reference 3.

A first preferred embodiment will be presented in conjunction with its fabrication steps with reference to FIG. 1A showing a plan view of the structure, and FIGS. 2A~2C showing the cross sectional views at A—A, at B—B and C—C, respectively, and FIG. 22 showing a plan view of a typical TFT-driven active matrix base.

A transparent glass base 1 having a 0.7 mm thickness was used as the substrate to deposit a chrome film of 150 nm thickness by sputter deposition, which was patterned in a photolithographic step to fabricate chrome films 2-1, 2-2 and 203. Chrome film 2-1 was made only at the start terminals 101At and their vicinity of the scanning lines 101A, and serves as a metal start terminal. Chrome film 2-2 was connected to signal line start terminals 102At of the signal lines 102A formed at the same time as a back-contact metal layer 16 (will be explained later), and also serves as a metal start terminal at 102At. Chrome film 2-3 is a light shielding film provided beneath the gate electrode 15 branched from the scanning line 101A.

Next, as an interlayer insulation film 3, a silicon oxide film of about 300 nm thickness was deposited at low temperature using, for example, an atmospheric chemical vapor deposition (CVD) process. Next, an indium-tin-oxide (ITO) film of about 50 nm was deposited by sputter deposition, and after photolithographic patterning steps, the other set of source/drain electrodes 4 and pixel electrodes 106A connected to the electrodes 4 and one set of source/drain electrodes 5 were fabricated.

Next, after the surfaces were doped with phosphorous using a phosphine (PH3) plasma processing, non-doped a-silicon film 6 and a low temperature silicon nitride film were serially deposited by a plasma CVD process, and after photolithographic steps, a laminated film layer, comprising islands of semiconductor layer 8 and a first gate INSULATION film 9, was fabricated. The plasma CVD process was performed with the substrate temperature at about 30° C. so that the surface phosphorous in the one set of source/drain electrodes 5 and other set of source/drain electrodes 4 were diffused into the non-doped a-silicon film 6, thereby forming an n-type semiconductor film 7 of about 5 nm thickness to provide electrical connections between one set of source/drain electrodes 5 and the other set of source/drain electrodes 4 with the semiconductor layer 8. In the next step, a low temperature silicon nitride film of about 300 nm thickness was deposited by plasma CVD to serve as a second gate insulation film 10, and using photolithographic steps, the following fabrications were performed: referring to FIG. 1, a contact hole 11-1 over the one set of source/drain electrodes 5 and a pixel opening 11-2 over the pixel electrode 106A and a contact hole 12-3 over the signal line 102A; a contact hole 12-4 over the light shielding film (2-3), a contact hole 12-1 over the scanning line start terminal 101At; and a contact hole 12-2 over the signal line start terminal 102At. The contact holes 11-1, 11-2, 12-1~12-4 can be made simultaneously by using a gaseous etching technique using $HF_4$ or $CHF_3$. This is made possible by the protective action against etching provided by the ITO film. Finally, chrome film 13 of about 150 nm thickness and chrome nitride film 14 of about 50 nm thickness were deposited serially by sputter deposition, and after patterning with photolithography, gate electrode 15 and scanning line 101A, back contact metal layer 16, the connecting electrode served by the scanning line terminal 103A and the connecting electrode served by the signal line terminal 104. The base assembly was annealed to obtain a completed active matrix base. Here, the chrome nitride film was formed by reactive sputtering in a gaseous mixture of argon and nitrogen with a ratio of argon to nitrogen flow volumes of 1:1. Etching of chrome nitride film 14/chrome film 13 was carried out using a dry etching technique (in this case, a chloride group gas, such as chlorine).

The active matrix base thus produced in Embodiment 1 has a plurality of signal lines 102A extending in parallel in one direction (Y-direction) and selectively covering the surface of a transparent plate 1. The signal line 102A is comprised primarily of a stripe-shaped chrome film 2-2 having a wide start terminal 102At and its own back-contact layer 16 for each pixel. The back-contact layer 16 is comprised by two layers, chrome nitride film 14/chrome film 13, and contacts one set of source/drain electrodes 5 made of ITO film through the contact hole 11-1 provided in the second gate INSULATION film 10, and also contacts the chrome film 2-2 through the contact hole 12-3 provided in the insulation film 17. The connecting electrode (104A) is provided on the signal line start terminal 102At formed in the insulation film 17. The connecting electrode (104A) is a signal line terminal, and is comprised by two layers, chrome nitride film 14/chrome film 13.

A plurality of parallel scanning lines 101A extend in X-direction, at right angles to Y-direction, and selectively covers over the insulation film 17 (includes second gate insulation film 10/interlayer insulation film 3) laid over the signal lines 102A.

Each scanning line 101A arranged in a stripe pattern is comprised by a laminated film layer including chrome nitride film 14/chrome film 13, wide start terminal 101At and one branched path 2-3 (for gate electrode 15) for each pixel. The start terminal 101At is connected to the chrome film 2-1 through the contact hole 12-1 provided in the insulation film 17. Further, each scanning line 101A contacts the chrome film 2-3 (light shielding film) at the branching location of the gate electrode 15 through the contact hole 12-4 provided in the insulation film 17.

At the intersecting location of the scanning line 101A and the signal line 102A, there is a sequential stagger TFT 105A acting as the switching element. The TFT 105A has one set of source/drain electrodes 5 connected to the signal line 102A, through the back-contact layer 16, and the other set of source/drain electrodes 4 which are integral with the pixel electrode 106A. The semiconductor layer 8 is provided bridging the one set of source/drain electrodes 5 and the other set of source/drain electrodes 4. The semiconductor layer 8 is comprised by non-doped a-silicon film 6 and n-type semiconductor film 7 making a contact with two sets of source/drain electrodes 4, 5. The gate electrode 15 is provided across the semiconductor layer 8 through the laminated gate insulation film layer comprised by the first gate insulation film 9 and the second gate insulation film 10.

A feature of the active matrix base made by the above process is that, because the surfaces (contacting surfaces) of the scanning line terminals 103A and the signal line terminals 104A are made of chrome nitride film, in the subsequent heat treatment steps (annealing in array fabrication and orientation film sintering in cell fabrication) the surface oxidation of chrome film is prevented, and the initial value of the press bonded resistance is lowered and stabilized. Although the surface of the chrome nitride is also oxidized during the heat treatment process, the thickness of the oxide thickness on the nitride film is about ⅕ of a chrome oxide film (about 10 nm), and when the base assembly is press bonded, the oxide film can be easily broken through by the ACF particles. Also, the specific resistance of nitride films of high melting point metals, such as chrome nitride, is between about 100–200 $\mu\Omega$cm which is similar to the specific resistance for transparent films, such as ITO, and is quite acceptable.

Figure 3A:
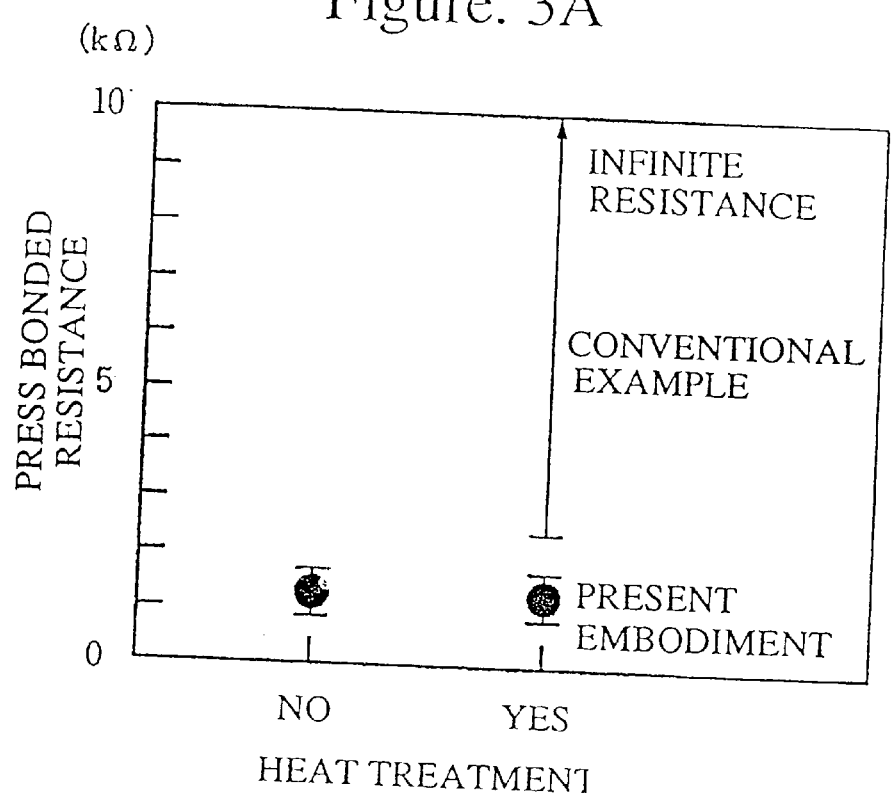
FIG. 3A is a graph comparing the changes in press bonded resistance with heat treatment in the present device and a conventional device.
Figure 3B:
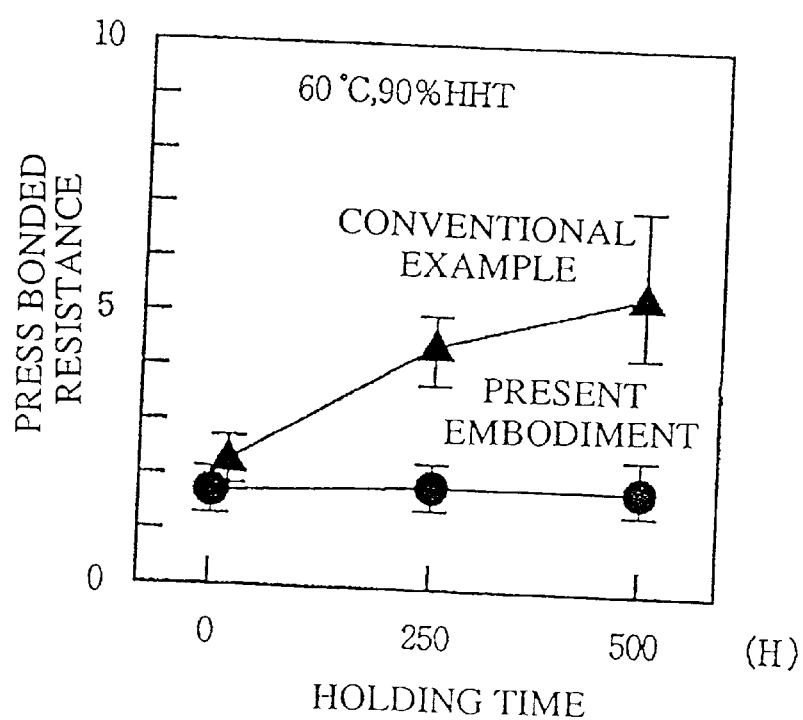
FIG. 3B is a graph showing the changes in press boding resistance at different heat treating temperatures in the present device and a conventional device.

FIG. 3A, 3B are graphs comparing the bonded interface resistance, based on an example of twenty terminals connected in series, of the base made in the first embodiment with that in a base made by a conventional process shown in FIG. 19. The ACF made by Sony, an improved CP7131, was used. The press bonding conditions were 20 Kg/cm$^2$ pressure applied at 180° C. FIG. 3A relates the bonded interface resistance before and after heat treatment at 300° C. for 30 minutes. The difference is negligible before the heat treatment, and although the heat treatment produced little difference in the present base, the heat treated conventional bases exhibited a wide scatter in the results, and in extreme cases, the resistance was infinite. FIG. 3B shows the results of high temperature, high humidity test (HHT) at 60° C. and 90%. There is little change in the resistance of the present base up to about 500 hours, but the conventional base exhibited a large increase with holding time.

Figure 4A:
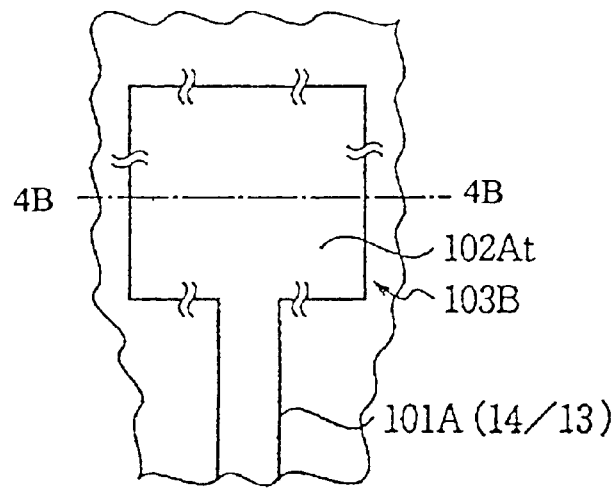
FIG. 4A is a plan view of a scanning terminal in Embodiment 2.
Figure 4B:
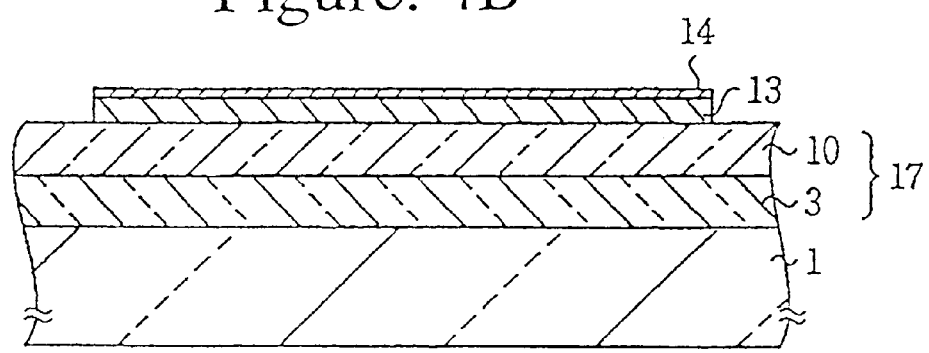
FIG. 4B is an enlarged cross sectional view seen at a plane A—A in FIG. 4A.

A second embodiment will be presented with reference to a plan view shown in FIG. 4A, and cross sectional view at 4B—4B shown in FIG. 4B.

The difference between this embodiment and Embodiment 1 is that there is no chrome film over the transparent base plate 1. The results were similar to the those reported in FIGS. 3A, 3B.

Figure 5:
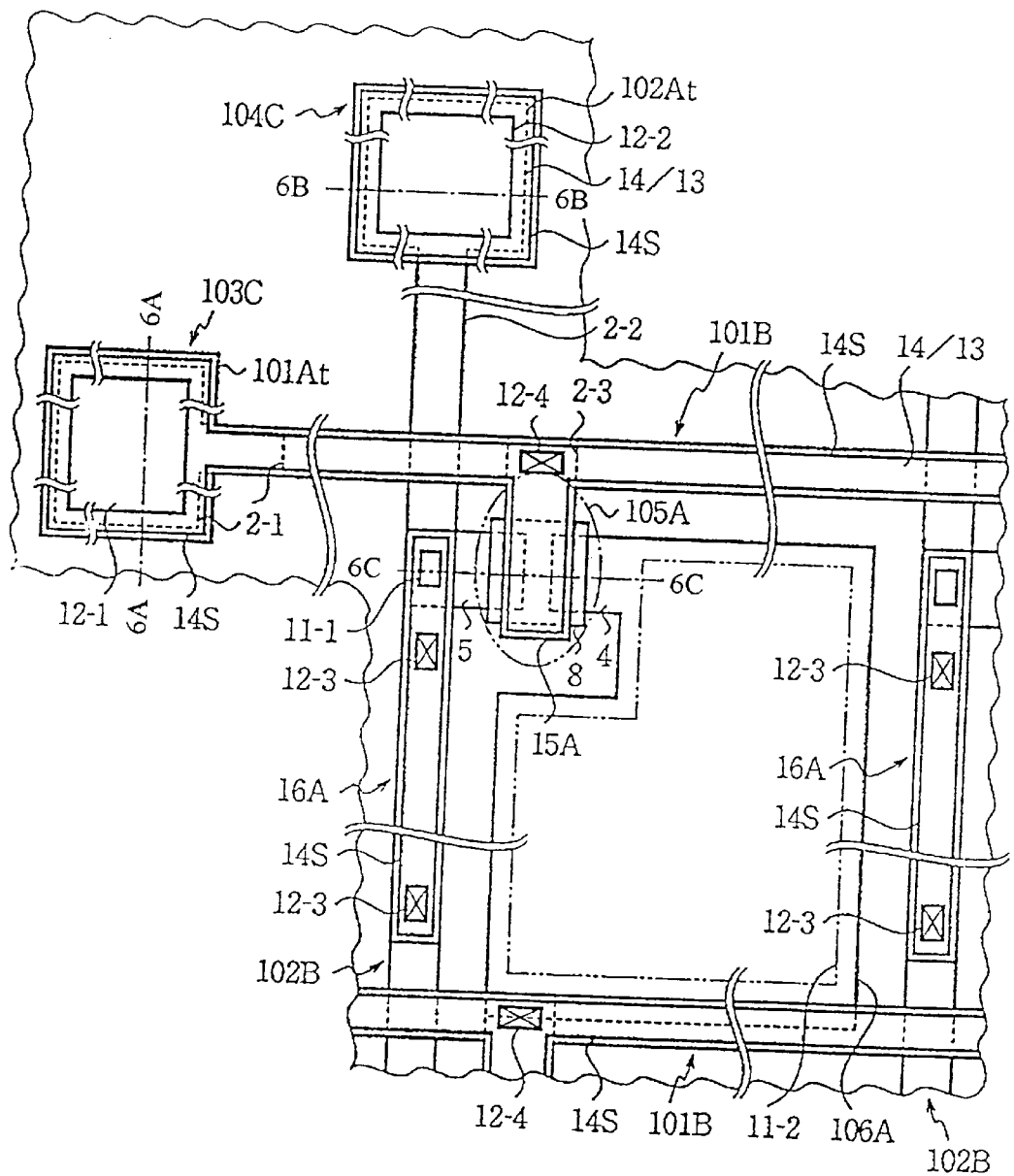
FIG. 5 is a plan view of a set of pixels in Embodiment 3.
Figure 6A:
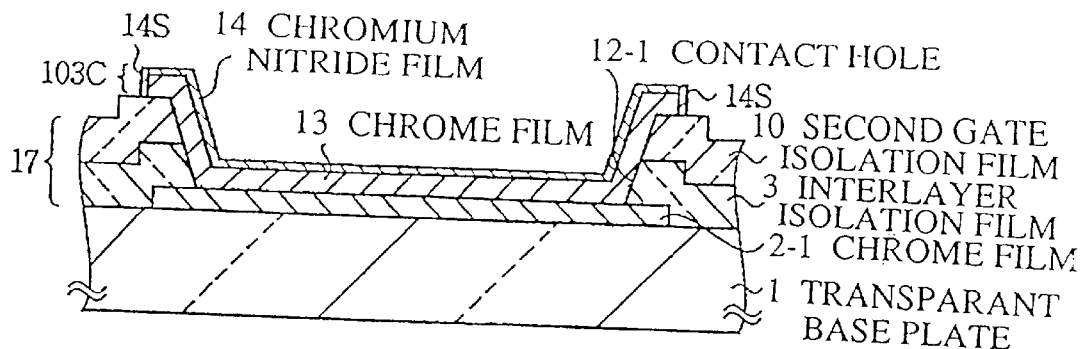
FIGS. 6A, 6B and 6C are enlarged cross sectional views of the device seen at a planes A—A, B—B and C—C in FIG. 5, respectively.
Figure 6B:
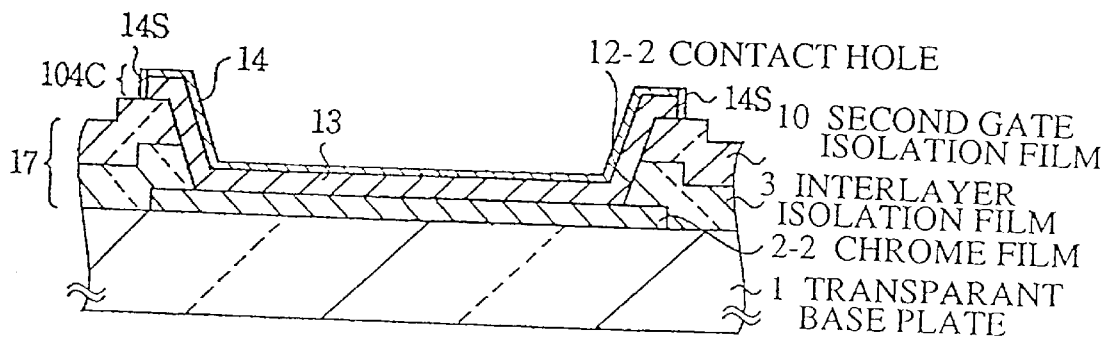
Figure 6C:
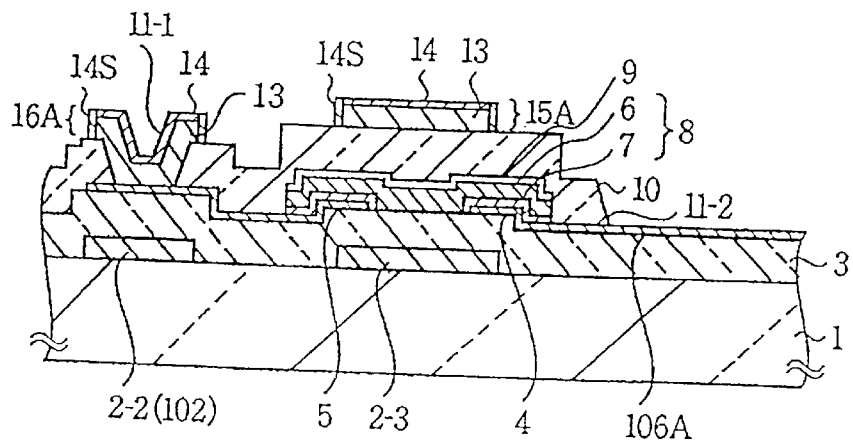

FIG. 5 is a plan view of Embodiment 3 and FIGS. 6A, 6B and 6C are cross sectional views seen at planes A—A, B—B and C—C in FIG. 5, respectively. In this embodiment, an additional lateral chrome nitride film 14S is provided on some of the structures of Embodiment 1 in the double film layer comprised by chrome nitride film 14/chrome film 13 (scanning lines 101B, gate electrodes 15A, back-contact metal layer 16A and signal line connecting electrodes). The chrome film is completely wrapped by the chrome nitride film, and the corrosion resistance is improved even more.

The method of manufacturing follows the steps to the stage shown in FIGS. 1 and 2 for Embodiment 1. Finally, after depositing a chrome nitride film of about 50 nm over all surfaces again using reactive sputtering, the entire base surface was etched back (anisotropic etching) by means of reactive ion etching so that chrome nitride film 14S was formed on the lateral surfaces of the chrome film 13. The base assembly was then annealed. It is also possible to use plasma processing based on nitrogen gas or ammonia gas to form chrome nitride film on the lateral surfaces of the chrome film 13. In this case, however, poor corrosion resistant materials, such as molybdenum and tungsten, are not suitable replacements for chrome, because thick nitride films are difficult to produce by plasma nitriding.

In Embodiment 4, the chrome film covering the insulation film 17 in Embodiments 1, 2 and 3 is replaced with a double film layer comprising an underlayer of tantalum nitride film or niobium film of about 50 nm thickness and a tantalum film of thickness about 150 nm. Also, it is possible to form a tantalum nitride film on the top and/or lateral surface of a pattern laid on the double film layer. On such an underlay film, it is easier to form an .-phase tantalum film which has a low specific resistance.

Figure 7:
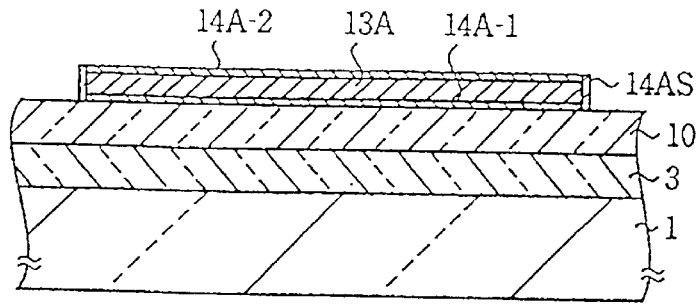
FIG. 7 is a cross sectional view of Embodiment 4.

FIG. 7 is a cross sectional view of a terminal structure in Embodiment 4, which has a scanning line signal terminal comprised of: a triple film lamination layer including tantalum nitride film 14A-1 of 50 nm thickness, tantalum film 13A of 150 nm thickness and tantalum nitride film 14-2 of 50 nm thickness; and tantalum nitride films 14AS formed on the lateral surfaces of the triple film lamination layer. In other words, this case corresponds to an application of the structure of Embodiment 4 to the structure presented in Embodiment 3 except that the contact hole 12-1 is not provided beneath the scanning line start terminal 101At. The connecting electrode on the signal line start terminal is also constructed similarly: i.e., tantalum nitride/tantalum/tantalum nitride constituting the triple film lamination layer and a tantalum nitride film on the lateral surfaces. The fabrication steps follow those of Embodiment 3: i.e., tantalum nitride film 14A-1 is made by reactive sputtering; tantalum film 13A by sputter deposition; and tantalum nitride film 14A-2 by reactive sputtering. This is followed by patterning, and tantalum nitride film is formed over all the patterned surface by reactive sputtering again. Finally, anisotropic etching or nitriding by plasma nitriding is performed on the lateral surfaces of the patterned tantalum film for external insulation.

Embodiments 1~4 presented above relate to active matrix bases driven by sequential stagger TFT as the switching element. Next embodiments relate to active matrix bases driven by reverse stagger TFT elements.

Figure 8:
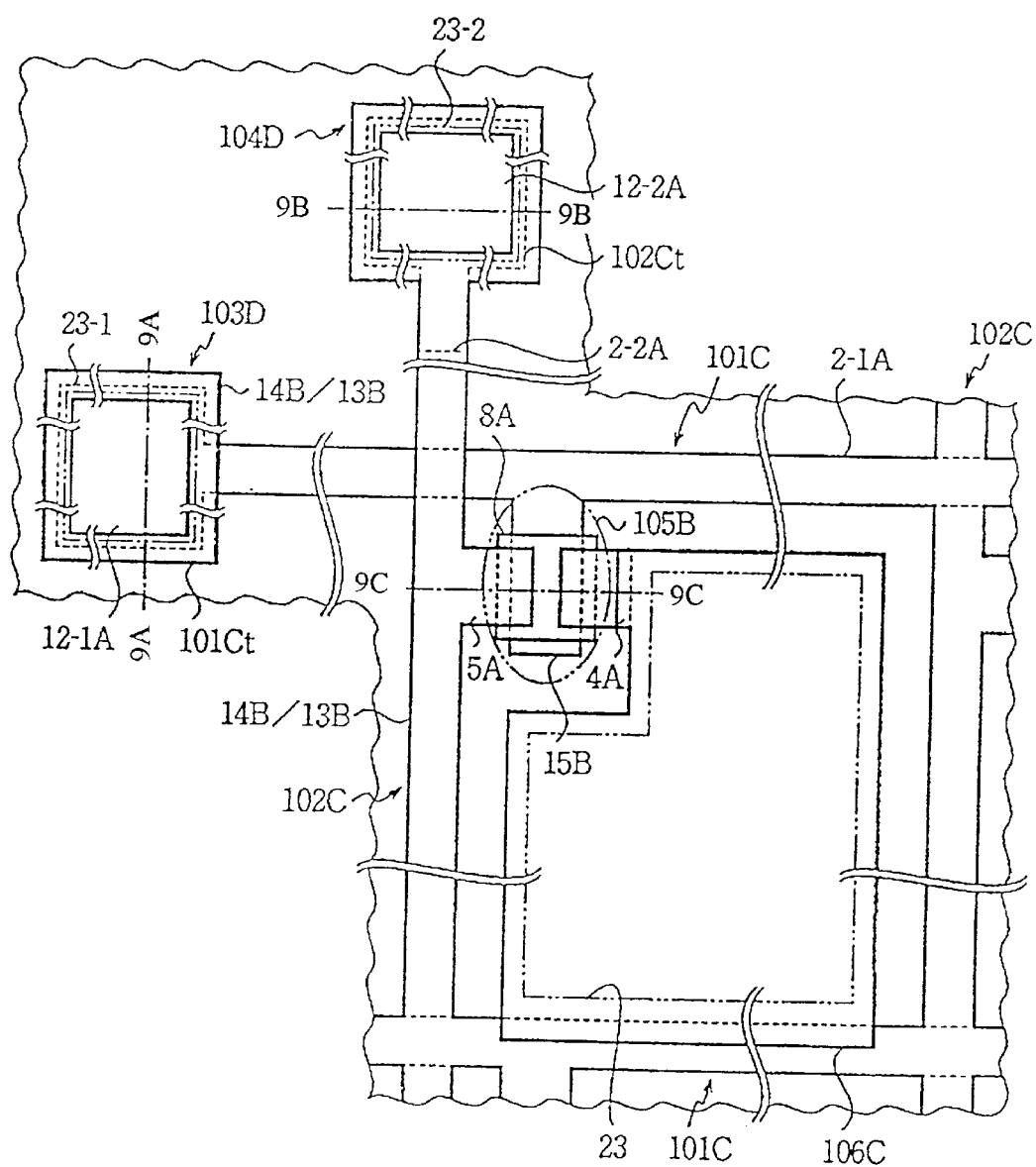
FIG. 8 is a plan view of a set of pixels in Embodiment 5.
Figure 9A:
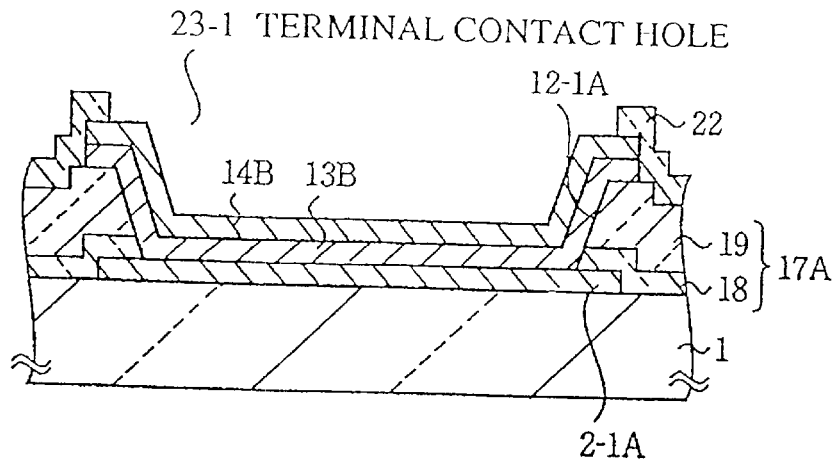
FIGS. 9A, 9B and 9C are enlarged cross sectional views of the device seen at planes A—A, B—B and C—C in FIG. 8, respectively.
Figure 9B:
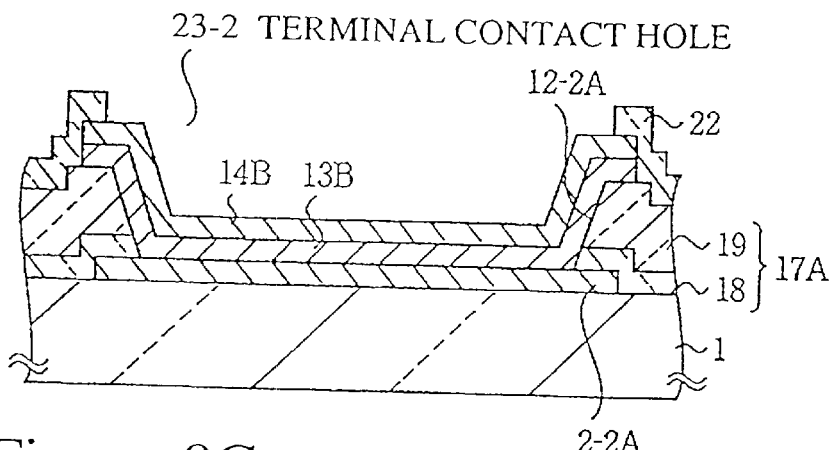
Figure 9C:
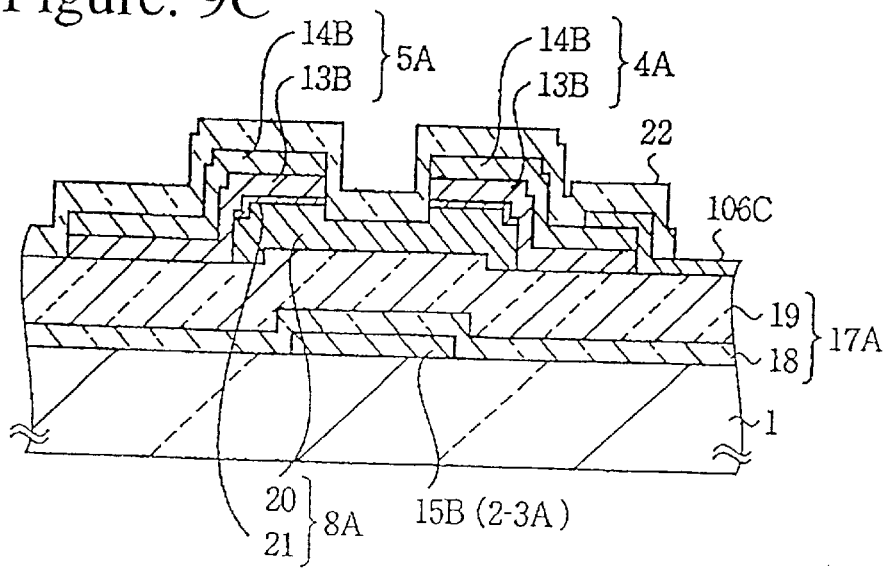

Embodiment 5 will be presented with reference to FIG. 8, and FIGS. 9A, 9B and 9C which are cross sectional views seen at planes A—A, B—B and C—C in FIG. 8, respectively, and FIG. 22. The method of fabrication was as follows. An aluminum-neodymium alloy film (referred to as Al—Nd hereinbelow) of 150 nm thickness was sputter deposited on a transparent plate 1 of 0.7 mm thickness. The surface was patterned by photolithography to produce layers of Al—Nd films 2-1A, 2-2A and 2-3A. The 2-1A layer was fabricated in a stripe pattern for making scanning lines 101C having a wide start terminal 101Ct and a branched path 2-3A (for gate electrode 15B) for each pixel element. The 2-2A layer was made only at or near the start terminal 102Ct of the signal line 102C. Next, first gate insulation film 18 of about 150 nm thickness was produced by depositing a low temperature silicon film by high-frequency sputter deposition. Next, second gate insulation film 19 of about 350 nm thickness was made by depositing a low temperature silicon film, followed by an in-situ CVD process performed serially depositing a non-doped a-silicon film of about 300 nm thickness and a P-doped a-silicon film of about 50 nm thickness. After photolithographic patterning, islands of semiconductor layer 8A, comprised by non-doped semiconductor thin film 20 and n-type semiconductor thin film 21, were formed over and across the gate electrode 15B. Next, by photolithographic steps, contact holes 12-1A, 12-2A were produced on Al—Nd films 2-1A, 2-2A in the terminal section. Next, a molybdenum film 13B of about 150 nm thickness and molybdenum nitride film 14B of about 150 nm thickness were produced serially by sputter deposition in-situ, and by photo-lithographic steps, the one set of source/drain electrodes 5A, the other set of source/drain electrodes 4A, signal lines 102C and their start terminals 102Ct, and contact electrodes (scanning line terminal 103D) overlaying the scanning line start terminals 101Ct, were produced. Each signal line 102C branches to a one set of source/drain electrodes 5A for each pixel. Etching of molybdenum nitride film/molybdenum film was carried out by dry etching (in this case, normally a fluoride group gas such as tetracarbon fluoride is used). An ITO film of about 100 nm thickness was then produced by sputter deposition, and after photolithographic steps, pixel electrodes 106C were formed, and then, using one set of source/drain electrodes 5A and other set of source/drain electrodes 4A as masking, channels were produced by etching the n-type semiconductor thin film 21 with a gaseous mixture of $CHF_3$ and chlorine. Finally, a low temperature silicon film of about 200 nm was deposited by using plasma CVD at 300° C. to make an insulation film 22, and after photolithographic steps, contact holes 23-1, 23-2 over the contact electrodes (103C, 104C) for opening 23 were produced to overlay the pixel electrode 106C. The base assembly was then annealed to complete the process of making an active matrix base.

The active matrix base thus produced in Embodiment 5 has a plurality of parallel scanning lines 101C extending in a specific direction (X-direction) overlaying selective regions of the transparent base plate 1. The signal lines 101C are provided with wide start terminals 101Ct and a branching path 2-3A (for gate electrode 15B) for each pixel. At the scanning line start terminal 101Ct, contact electrodes (103D), comprised of molybdenum nitride film 14B/molybdenum film 13B, are provided. Contact electrodes (103D) are connected to Al—Nd film 2-1A of the scanning line start terminal through the contact holes 12-1A provided on the insulation films 17A (second gate insulation film 19/first gate insulation film 18). The peripheral sections of the contact electrodes 103D are overlaid with the insulation film 22.

A plurality of parallel signals lines 102C extend in the Y-direction, at right angles to the X-direction, overlaying selected regions of the insulation films 17A on the scanning lines 10C. The signal lines 102C are provided in a stripe pattern with wide start terminals 102Ct and a set of branched source/drain electrodes 5A for each pixel. The signal lines 102C is a double film layer comprised of a molybdenum nitride film 14B/molybdenum film 13B. The signal line start terminal 102Ct is connected to Al—Nd film 2-2A (provided only at the start terminal 102Ct and its vicinity) through the contact hole 12-2A on the insulation films 17A. The start terminal 102Ct serves also as the connecting electrode (104D) for the signal line, and the electrical insulation is provided by the insulation film 22.

At each intersection point of the scanning lines 101C with the signal line 102D, reverse stagger TFT 105B is provided as the switching element. The gate electrode 15B for the reverse stagger TFT 105B is comprised by Al—Nd film 2-3A branched from the signal line 101C. The laminated gate insulation films (17A), comprised by the first gate insulation film 18C successively overlaying the second gate insulation film 19, is provided over the gate electrode 15B, and a semiconductor layer 8A comprised by a non-doped semiconductor thin film 20 and an n-type semiconductor thin film 21, is provided to selectively overlay the laminated gate insulation film 17A. The semiconductor layer 8A is connected to one set of source/drain electrodes 5A and the other set of source/drain electrodes 4A. Those regions of the n-type semiconductor thin film 21 of the semiconductor layer 8A which do not make contact with the electrodes 5A and 4A are removed. The other set of source/drain electrodes 4A is connected with the pixel electrode 106C made of an ITO film.

The structure of Embodiment 5 is obviously different from that of Embodiment 1 in the type of TFT, however other differences, i.e., the different electrode material and the use of insulation film 22 at the peripheral ends, are important features.

Molybdenum film 13B and molybdenum nitride film 14B are inferior in their corrosion resistance compared with chrome film 13A and chrome nitride film 14A. However, by making the thickness of molybdenum nitride film 14B at least 100 nm, and overlaying all the surfaces, excepting the terminal contact holes, with a silicon nitride film (22), it has been possible to achieve the same results as those in Embodiment 1.

Figure 10:
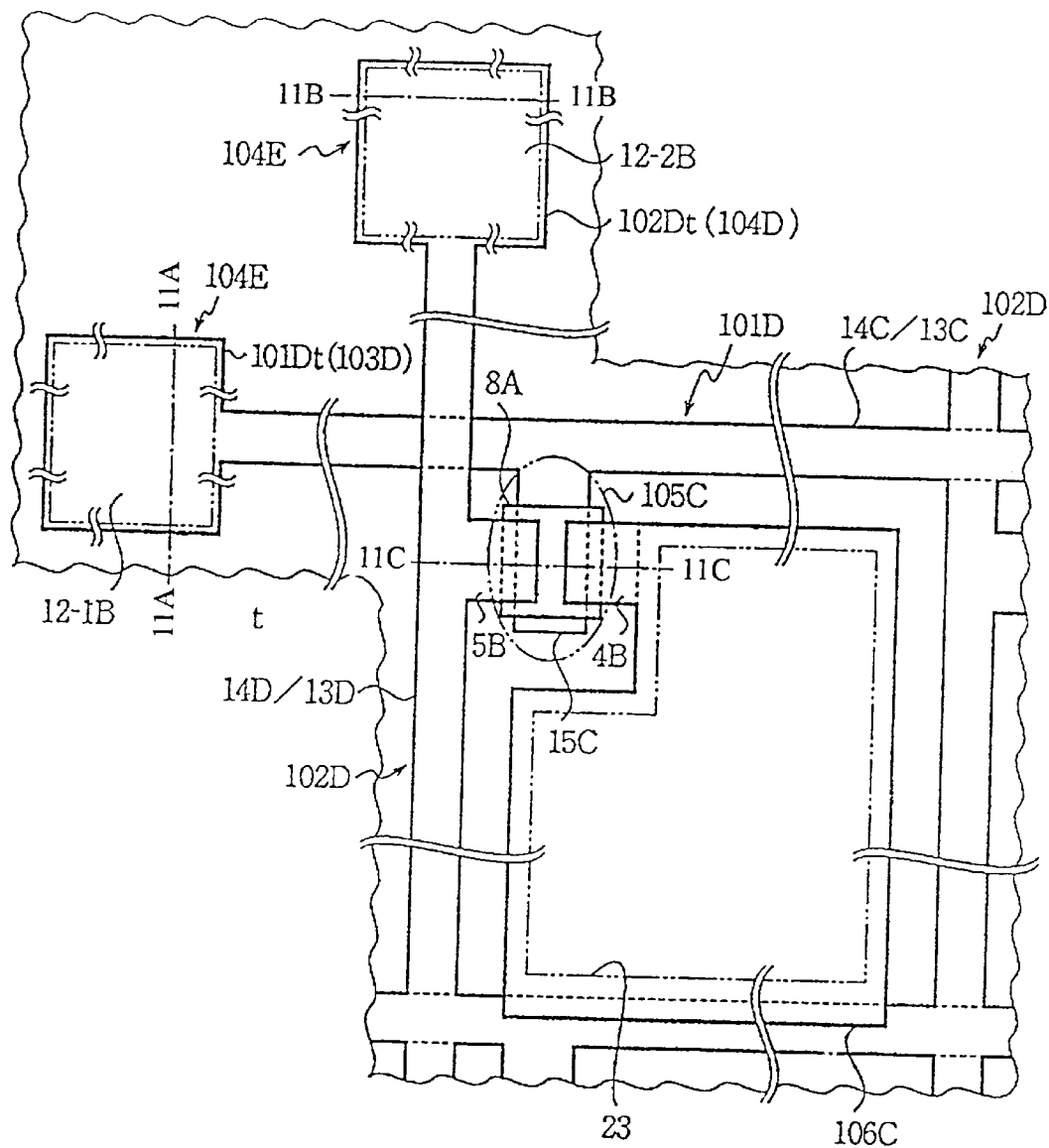
FIG. 10 is a plan view of a set of pixels in Embodiment 6.
Figure 11A:
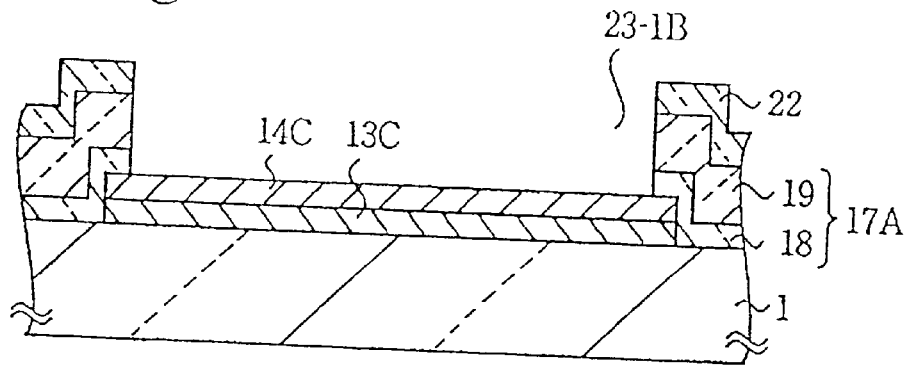
FIGS. 11A, 11B and 11C are enlarged cross sectional views of the device seen at planes A—A, B—B and C—C in FIG. 10, respectively.
Figure 11B:
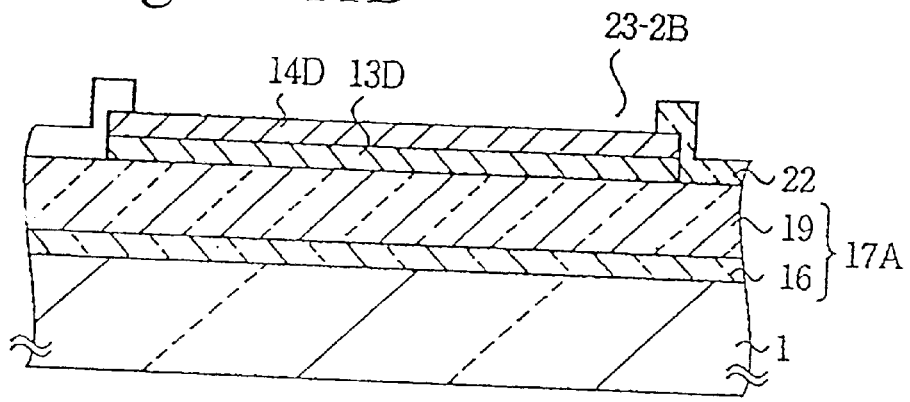
Figure 11C:
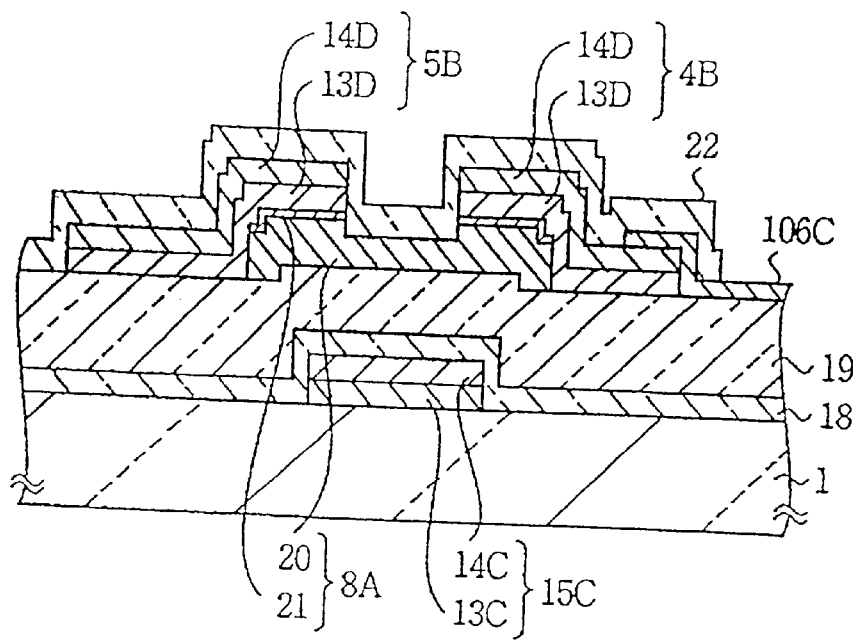

FIG. 10 presents a plan view of Embodiment 6 and FIGS. 11A, 11B and 11C are cross sectional views seen at planes A—A, B—B and C—C in FIG. 10, respectively. The differences of Embodiments 6 from 5 are as follows.

First, the scanning line 101D is a laminated structure comprised of: molybdenum-tungsten alloy film (Mo—W film hereinafter) 13C of about 150 nm thickness; and Mo—W—N film 14C of about 150 nm thickness produced by sputter deposition using a molybdenum-tungsten alloy target in an nitrogen atmosphere; and the start terminal section 101Dt is directly made to serve the function of gate connecting electrode (scanning line terminal 103E).

Second, the signal line 102D is also a laminated structure, made of Mo—W film 13D of about 150 nm thickness and Mo—W—N film 14D of about 150 nm thickness, and the start terminal section 102Dt is directly made to serve the function of connecting electrode (signal line terminal 104E).

Third, the terminal contact hole 23-1B over the start terminal section 101Dt of the scanning line 101D passes through a triple film layer, comprised by a silicon nitride film 22/a second gate insulation film 19/a first gate insulation film 18, and similarly, the contact hole over the signal start terminal 102Dt passes through the silicon nitride film 22.

As well, the gate electrode 15C for the reverse stagger TFT 105C is a double film layer comprised by Mo—W—N film 14C and Mo—W film 13C, and one set of source drain electrodes 5B and the other set of source/drain electrodes 4B are also double film layers comprised by Mo—W—N film 14D and Mo—W film 13D. The performance results were essentially the same as those in Embodiment 5.

Figure 12:
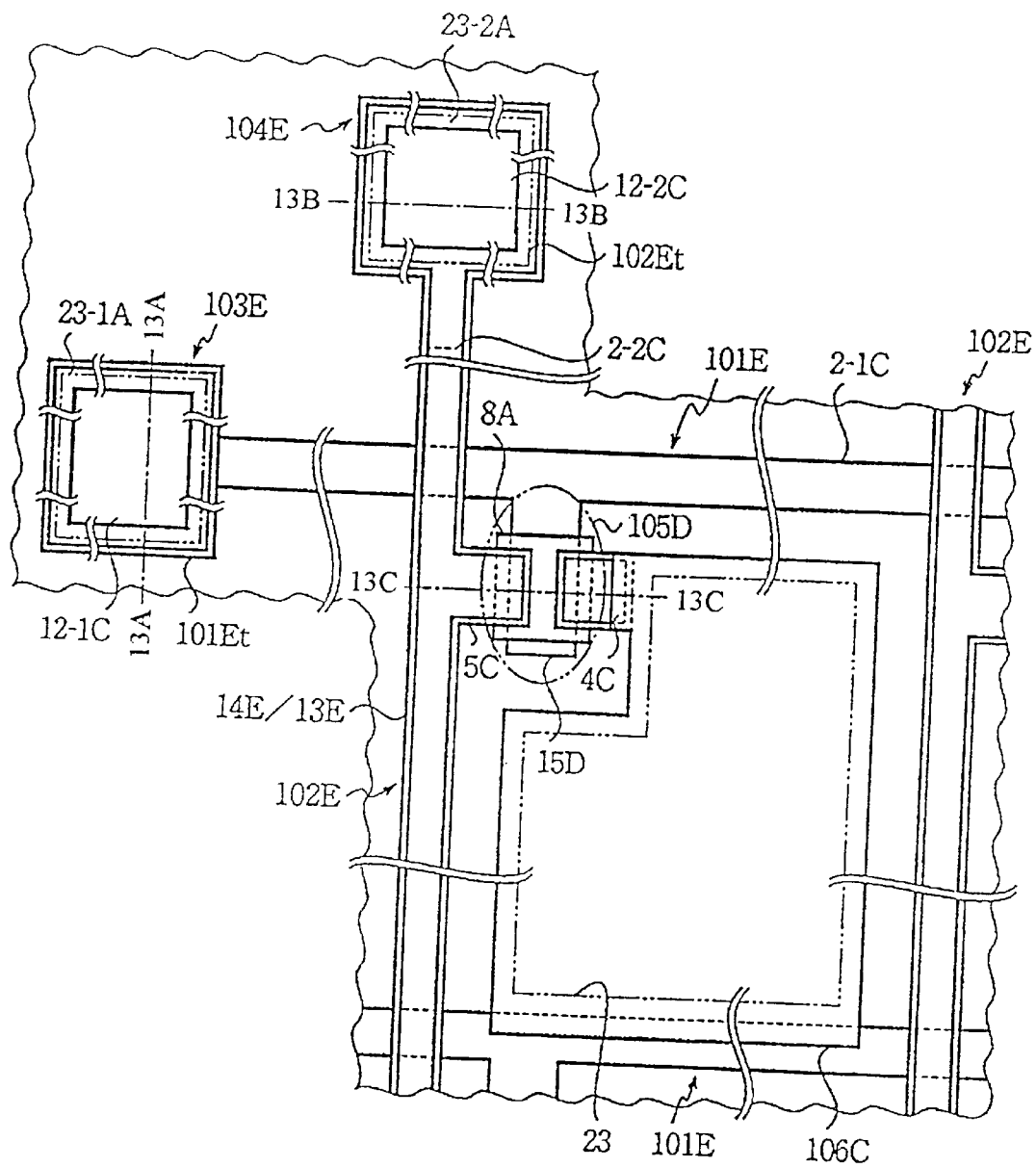
FIG. 12 is a plan view of a set of pixels in Embodiment 7.
Figure 13A:
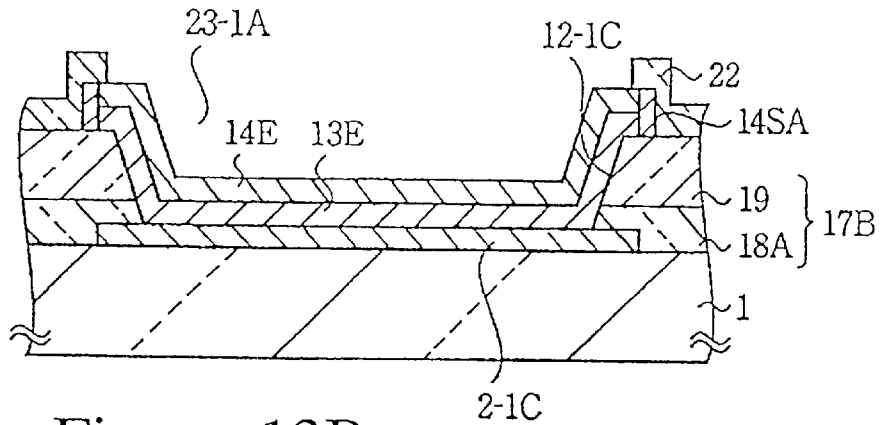
FIGS. 13A, 13B and 13C are enlarged cross sectional views of the device seen at planes A—A, B—B and C—C in FIG. 12, respectively.
Figure 13B:
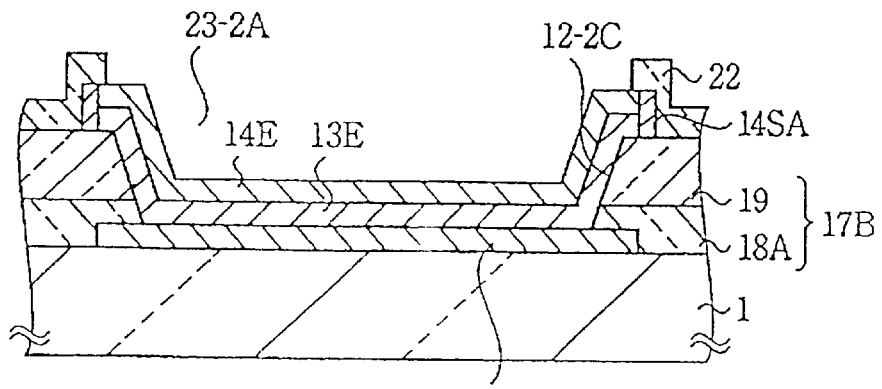
Figure 13C:
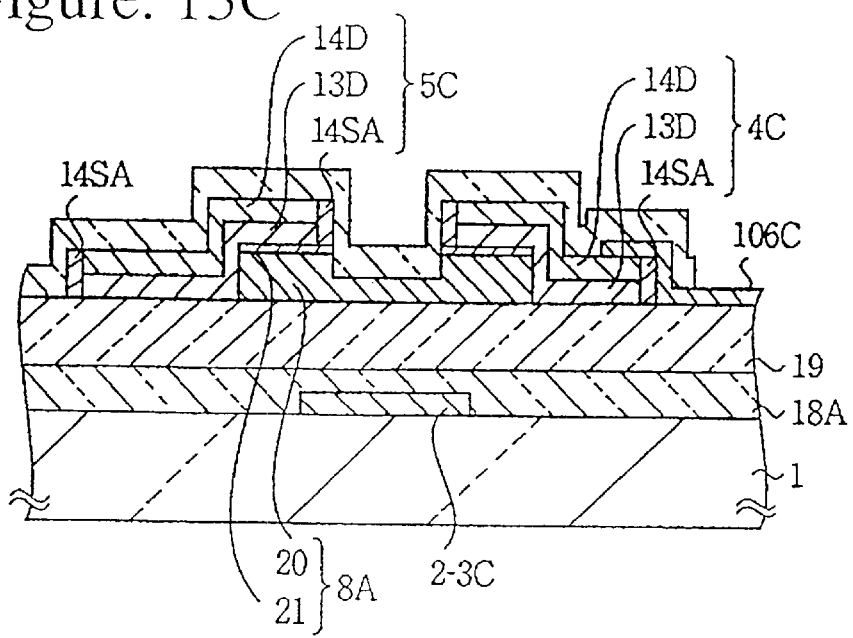

FIG. 12 is a plan view of Embodiment 7 and FIGS. 13A, 13B and 13C are cross sectional views seen at planes A—A, B—B and C—C in FIG. 12, respectively. The differences of the Embodiments 7 from 5 are as follows.

Instead of the Al—Nd film 2-1A, 2-2A and 2-3A, molybdenum-tungsten alloy films (Mo—W films hereinbelow) 2-1C, 2-2C and 2-3C of about 150 nm thickness were used. Instead of the low temperature silicon oxide (18) for the first gate insulation film, a coating of polysirazane (a polymer-based coating containing ceramic particles), made by Tonen Co., was applied and sintered to make an insulation film 18A of about 300 nm thickness. The molybdenum film 13B and molybdenum film 14B were replaced with tungsten film 13E and tungsten nitride film 14E, respectively, both having a thickness of about 150 nm. The lateral walls of the patterned laminated film layers 14E/13E were covered with tungsten nitride film 14SA.

The method of making the tungsten nitride film 14SA followed the process for the chrome nitride film 14S in Embodiment 3, excepting that the plasma processing is not suitable, in this case. The insulation film 18A was made by a coating/sintering process, therefore, the surface planarity was good, and the thickness of about 150 nm could be produced over the gate electrodes 15D (2~3C).

The advantage of this method is that superior flatness can be produced compared with Embodiments 5, 6.

Figure 14:
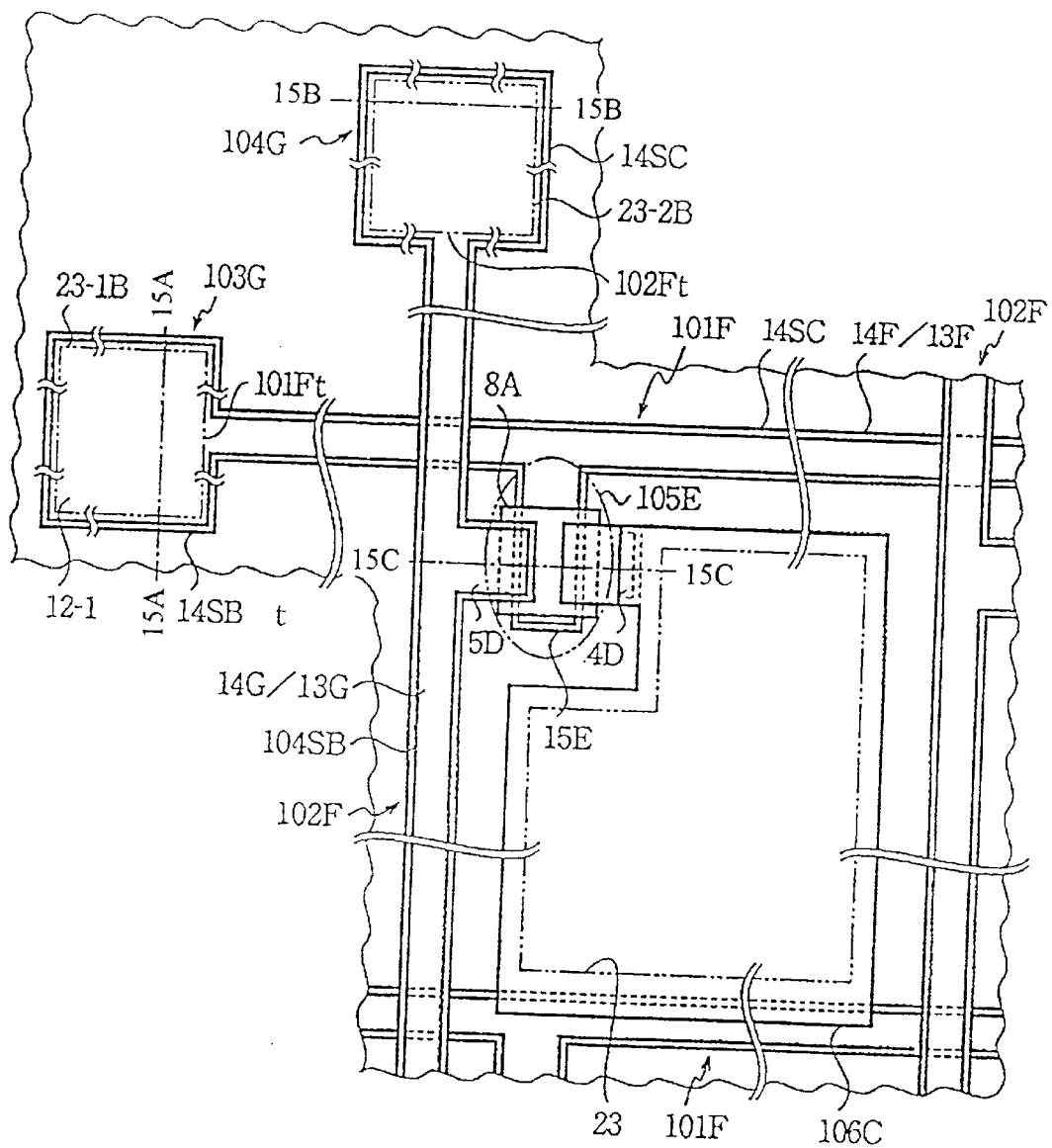
FIG. 14 is a plan view of a set of pixels in Embodiment 8.
Figure 15A:
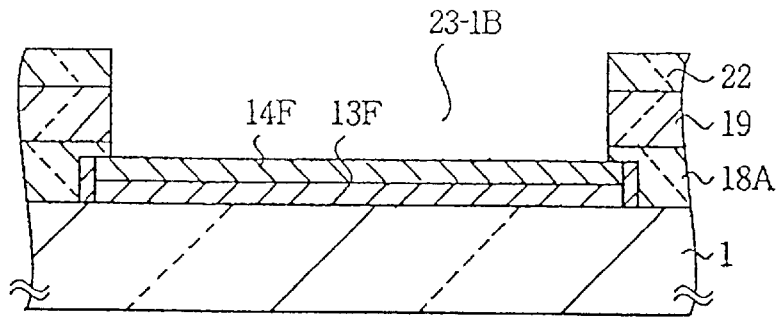
FIGS. 15A, 15B and 15C are enlarged cross sectional views of the device seen at planes A—A, B—B and C—C in FIG. 14, respectively.
Figure 15B:
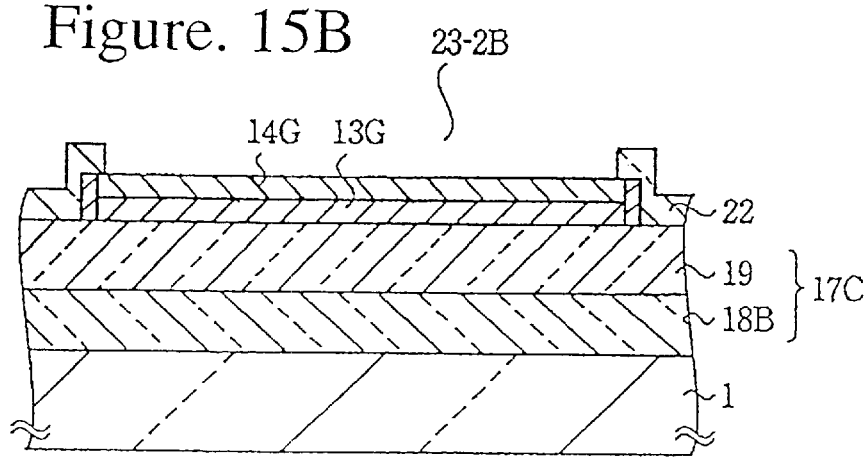
Figure 15C:
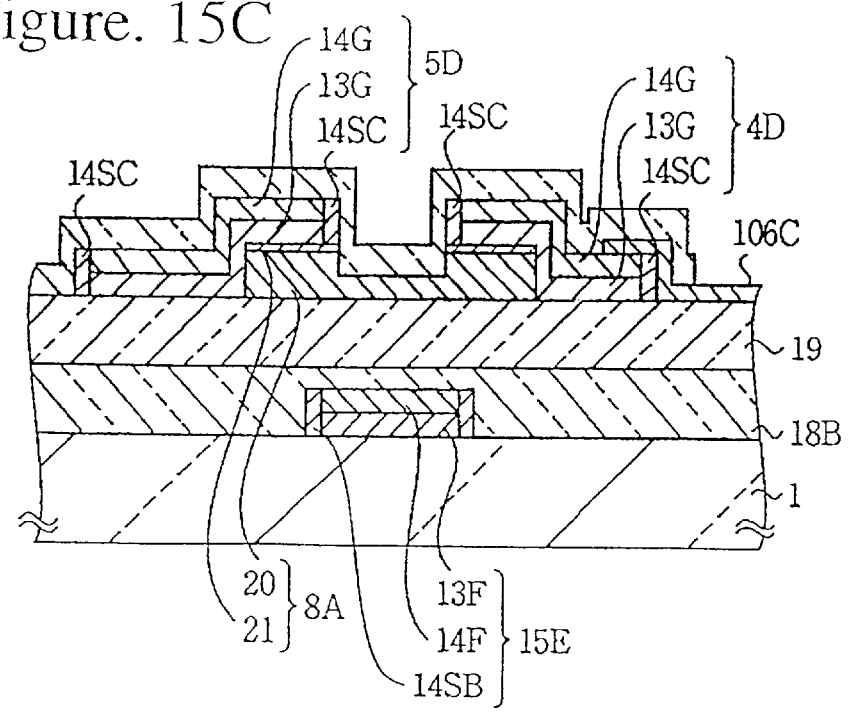

FIG. 14 is a plan view of Embodiment 8 and FIGS. 15A, 15B and 15C are cross sectional views seen at planes A—A, B—B and C—C in FIG. 14, respectively. In this base, the scanning lines 101F having the branching gate electrode 15E were produced by forming molybdenum nitride film 14SB of about 150 nm thickness on the lateral walls of a patterned structure of laminated films comprised of molybdenum film 13F of about 150 nm thickness and molybdenum nitride film 14F of about 150 nm thickness. This structure permits the scanning line start terminals 101Ft to function directly as the connecting electrode (scanning line terminals 103G). Overlaying the connecting electrodes (103G), a coating of polysirazan made by Tonen was applied and sintered to made a first gate insulation film 18B of about 400 nm thickness (giving about 100 nm on the gate electrode 15E); followed by the second gate insulation film 19 (350 nm thickness) made by depositing low temperature silicon oxide film by plasma CVD; and finally the terminal contact holes 23-1B were provided on the low temperature silicon oxide film 22 (200 nm thickness) made by plasma CVD.

The semiconductor layer 8A selectively overlays the gate insulation film 17C (19/18B) of the gate electrode 15E.

The signals lines 102F, branching one set of source/drain electrodes 5D, were produced by depositing molybdenum nitride film 14SC of about 150 nm on the lateral walls of a patterned structure of laminated films comprised by molybdenum film 13G of about 150 nm thickness and molybdenum nitride film 14G of about 150 nm thickness. This structure permits the signal line start terminal 102Ft to function directly as the insulation film (signal line terminal 104F). The terminal contact holes 23-2B were produced on the low temperature silicon nitride film 22 over the contact electrodes (104G). The other set of source/drain electrodes 4D is also comprised by a laminated film layer as in the one set of source/drain electrodes 5D.

Molybdenum nitride films 14SB, 14SC were made by depositing molybdenum nitride on the entire surface and etching back to a desired depth.

Figure 16:
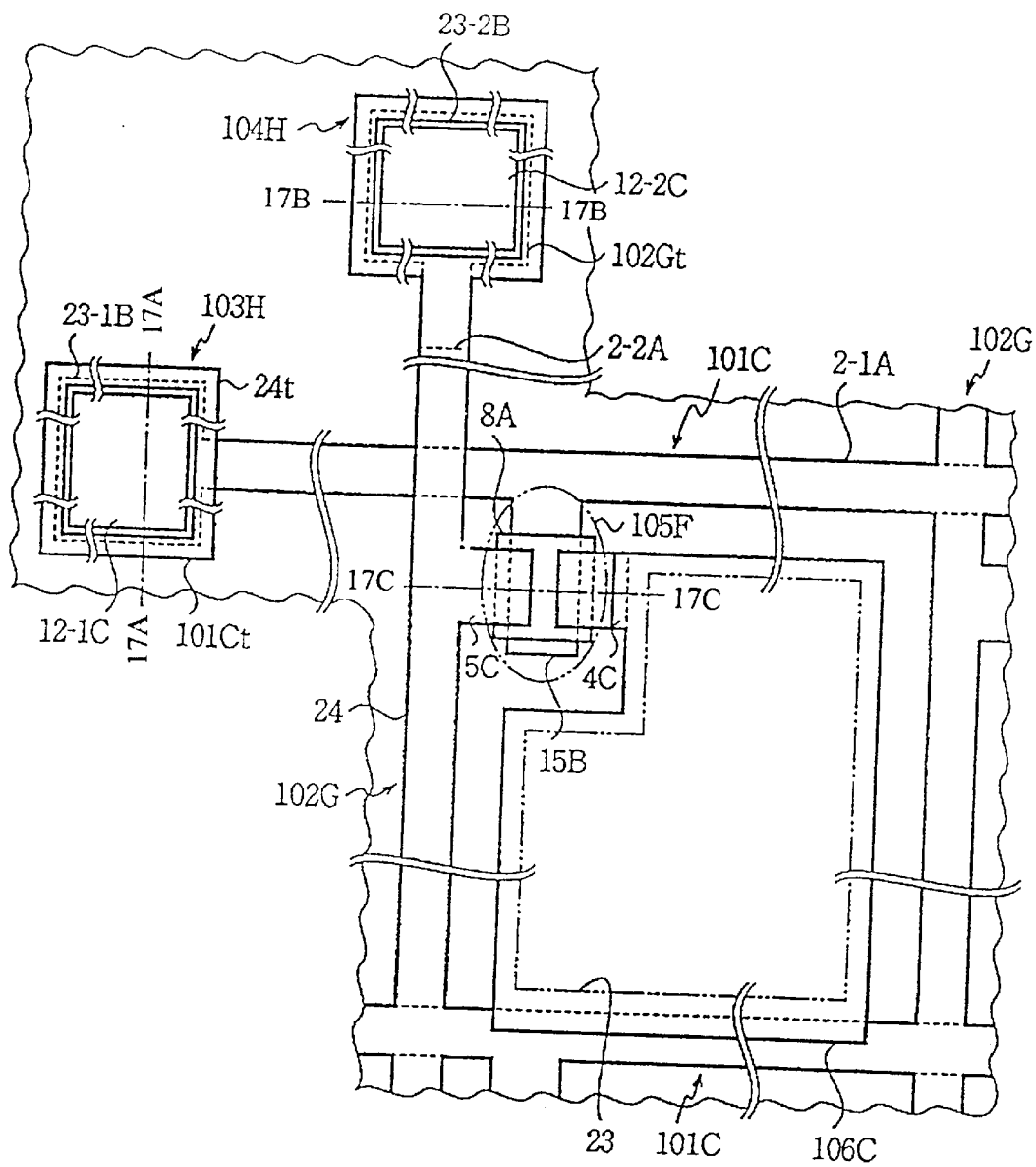
FIG. 16 is a plan view of a set of pixels in Embodiment 9.
Figure 17A:
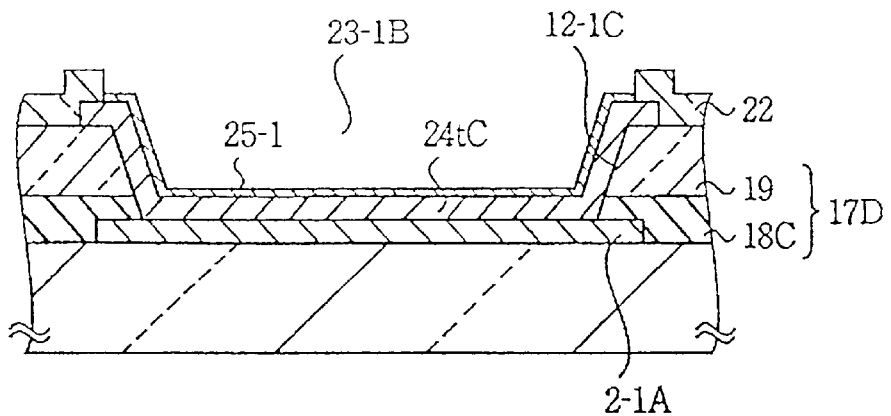
FIGS. 17A, 17B and 17C are enlarged cross sectional views of the device seen at planes A—A, B—B and C—C in FIG. 16, respectively.
Figure 17B:
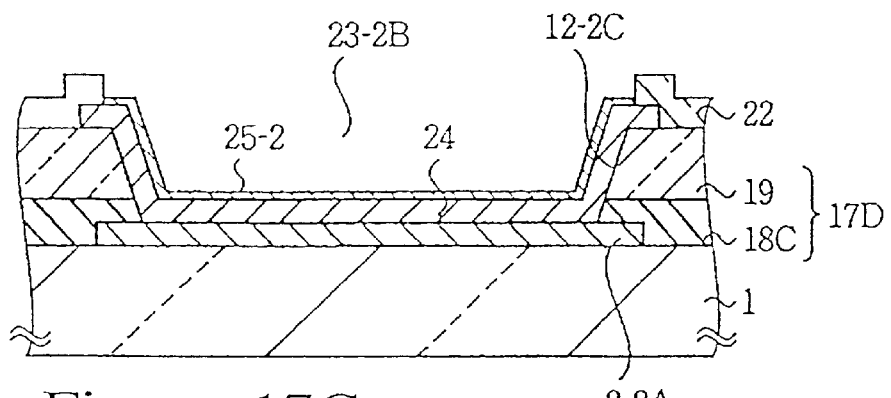
Figure 17C:
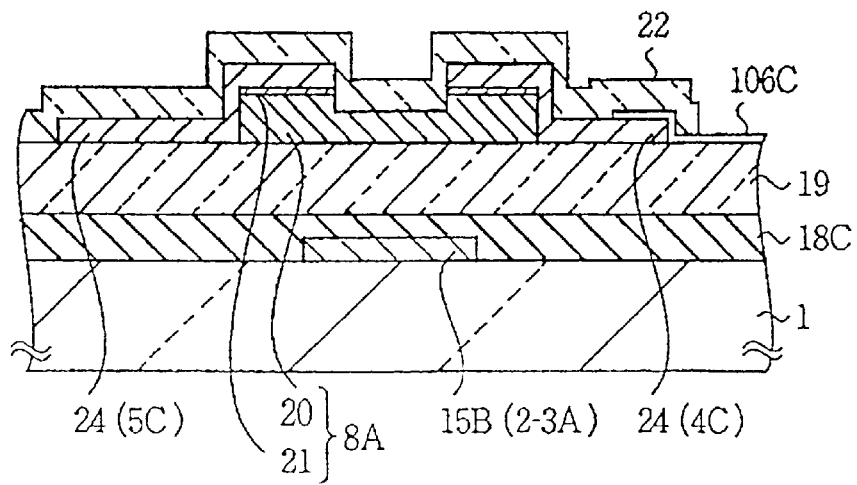

FIG. 16 is a plan view of Embodiment 9, and FIGS. 17A, 17B and 17C are cross sectional views seen at planes A—A, B—B and C—C in FIG. 16, respectively.

This base structure is similar to that of Embodiment 5 in that Al—Nd film 2-1A, 2-2A, 2-3A of about 150 nm thickness selectively overlays a transparent base plate 1. A coating (benzocyclobutane resin made by Dow Chemical Co.) was applied on top of the Al—Nd film 2-1A, 2-2A, 2-3A on the base plate 1, and the coating was sintered to produce a planar surfaced first gate insulation film 18C (thickness 300 nm, 150 nm on top of the Al—Nd film) followed by depositing low temperature silicon by plasma CVD to make the second gate insulation film 19. The semiconductor layer 18A selectively overlays the laminated gate insulation film 17D (19/18C), and a deposit layer of Al—Nd film 24 of about 150 nm is further provided. The Al—Nd film 24 is patterned to produce signal lines 102G (having branched one set of source/drain electrodes 5C), the other set of source/drain electrodes 4C, and the Al—Nd film 24t located at the right top of scanning line start terminal 101C.

The connecting electrodes of the scanning lines (scanning terminals 103H) is comprised by: an Al—Nd film 24t connected to Al—Nd film 2-1A through the contact hole 12-2C on the laminated gate insulation film 17D overlaid on the scanning line start terminal 101Ct; and an Al—Nd nitride film (Al—Nd—N film 25-1) self-aligning in the collector terminal holes 23-1B fabricated on the silicon nitride film 22 covering the periphery section of the Al—Nd film 24t.

The connecting electrodes of the signal lines (signal terminals 104H) is comprised by: signal line start terminal 102Gt (Al—Nd film 24) connected to Al—Nd film 2-2 through contact holes 12-2C fabricated on Al—Nd film 2-2 and on the laminated gate insulation film 17D; and an Al—Nd—N film 25-2 self-aligning in the terminal contact holes 23-2B fabricated on the silicon nitride film 22 covering the periphery section of the start terminal 102Gt.

The features of the method of making the base structure are as follows: silicon nitride film 22 is deposited first and, after making the contact holes 23-1B, 23-2B, Al—Nd—N film is produced by plasma processing in a nitrogen or ammonia atmosphere. The conditions for plasma processing in a normal in-line plasma CVD apparatus were, for example: flow rate of ammonia gas at 400 sccm, pressure of 100 Pa, high frequency power 1,000 W (at 13.56 MHz), and the process required about 30 minutes to produce films of Al—Nd—N film 25-1, 25-2 of about 5 nm thickness.

The advantages and results of this base structure is the same as those described for Embodiment 1. It should be noted that, because nitride film of aluminum is an electrical insulator, and has electrical properties different from those of high temperature melting point metals, such as chrome, tantalum, molybdenum and tungsten, it is necessary to use ACF particles that can penetrate the Al—Nd—N film, including aluminum nitride, and any oxide film that may have formed on the surface. Also, because the thickness of the metal nitride film is thin, it is not suitable to use molybdenum or tungsten films or their alloy films having poor corrosion resistance, instead of Al—Nd film.

Figure 18:
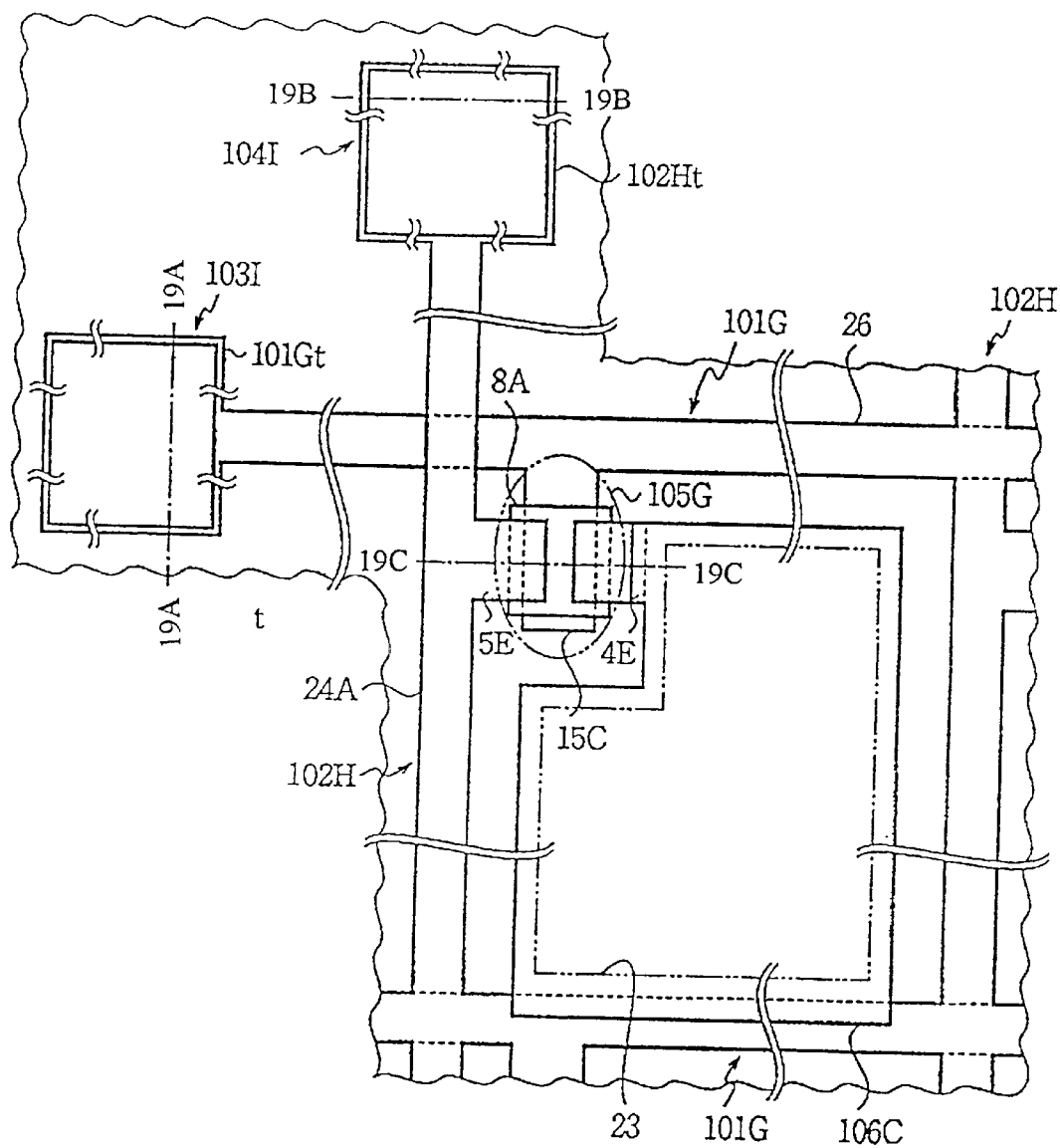
FIG. 18 is a plan view of a set of pixels in Embodiment 10.
Figure 19A:
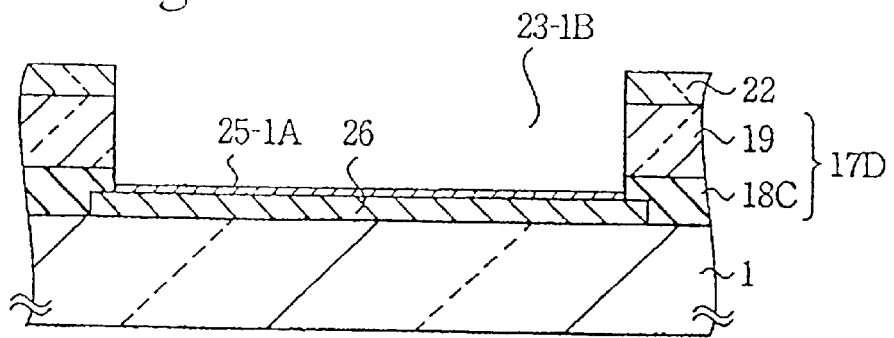
FIGS. 19A, 19B and 19C are enlarged cross sectional views of the device seen at planes A—A, B—B and C—C in FIG. 18, respectively.
Figure 19B:
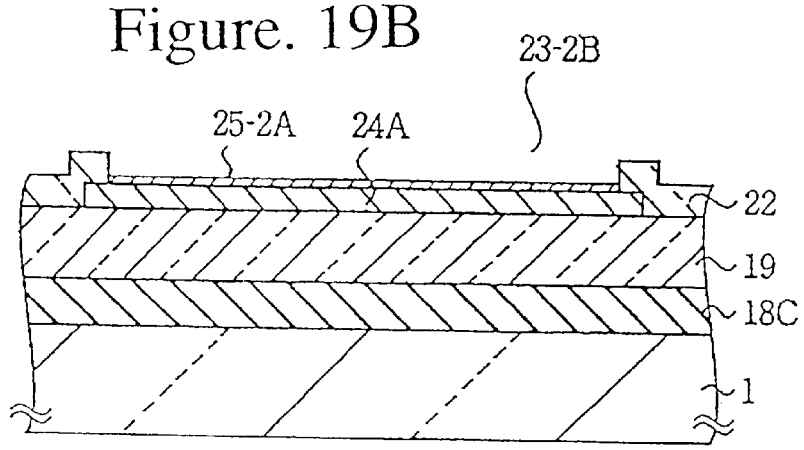
Figure 19C:
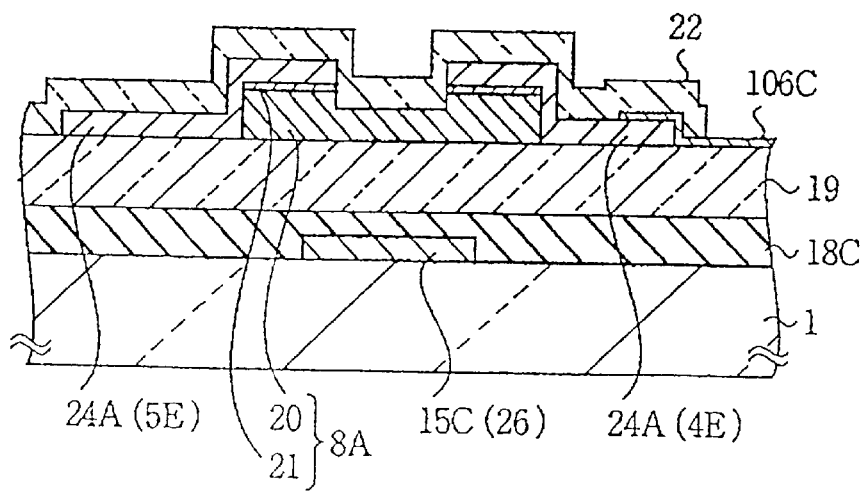

FIG. 18 is a plan view of Embodiment 9, and FIGS. 19A, 19B and 19C are cross sectional views seen at planes A—A, B—B and C—C in FIG. 18, respectively. In this structure, the scanning line 101G and its branched gate electrodes 15C are made of alloy films of aluminum/tantalum/titanium (Al—Ta—Ti film hereinbelow) 26 of about 150 nm thickness, and the signal lines 102H and the branched one set of source/drain electrodes 5E and the other set of source/drain electrodes 4E are made of Al—Ta—Ti film 24A of about 150 nm thickness. Nitride films of Al—Ta—Ti layer (Al—Ta—Ti—N film 25-1A, 25-2A) are deposited by self-aligning in the terminal contact holes 23-1B, 23-2B over the start terminals 101Gt, 102Ht. The first gate insulation film is the same as that in Embodiment 8. The method of forming the Al—Ta—Ti—N film follows the Al—Nd—N film formation process presented in Embodiment 8. The comments relating to AFC particles also apply.

The foregoing base structures in Embodiments 5~10 relate to reverse stagger TFT driven bases. The following embodiment presents a case of utilizing MIM as the switching element in the active matrix base.

Figure 20:
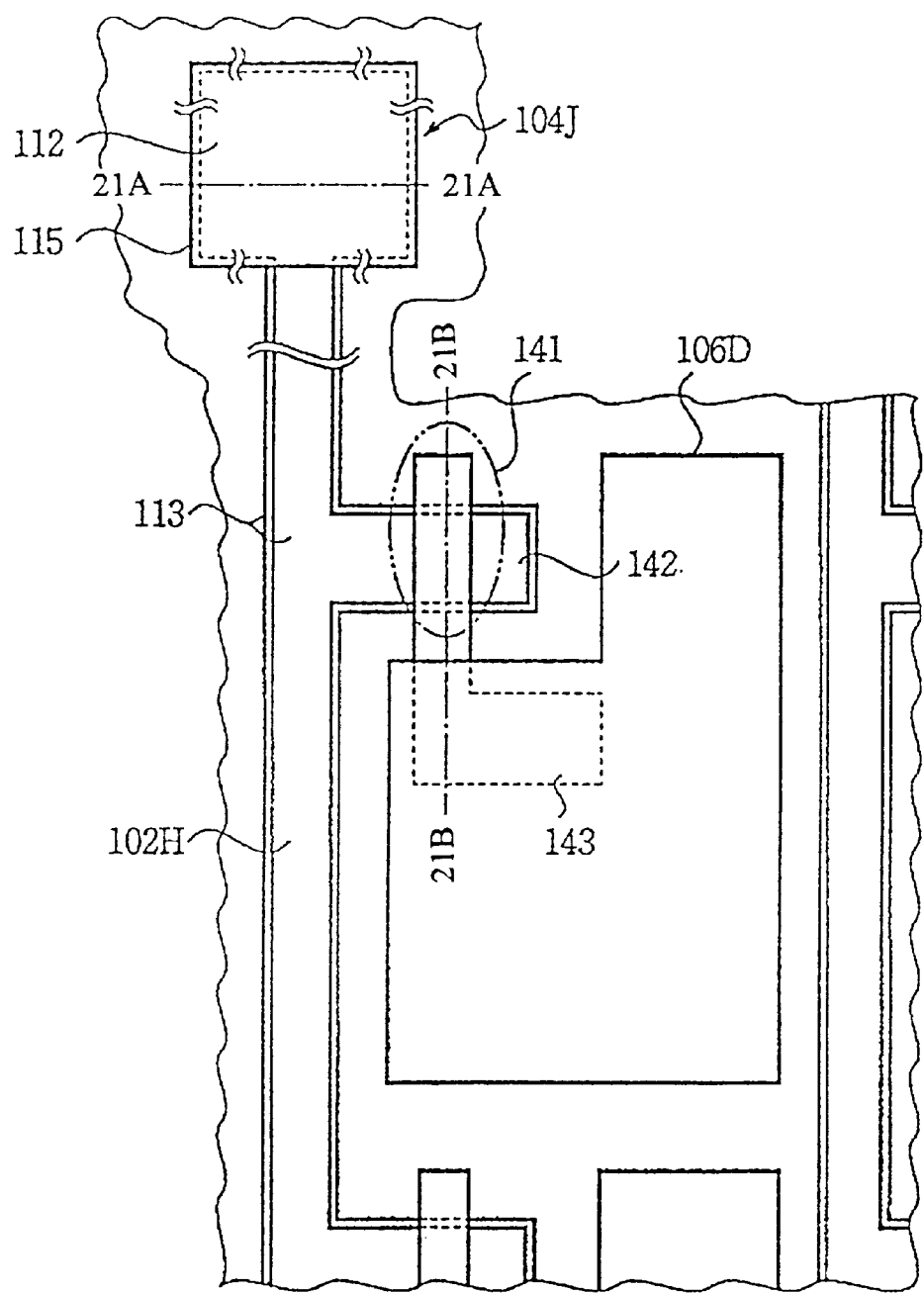
FIG. 20 is a plan view of a set of pixels in Embodiment 11.
Figure 21A:
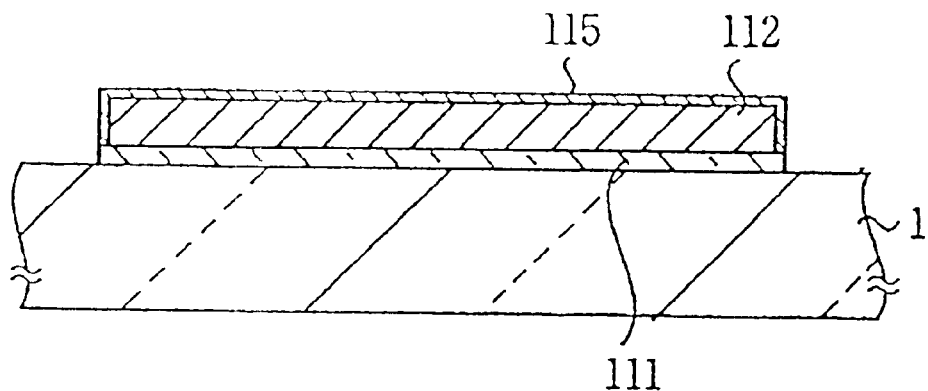
FIG. 21A, 21B are enlarged cross sectional views of the device seen at planes A—A and B—B in FIG. 20, respectively.
Figure 21B:
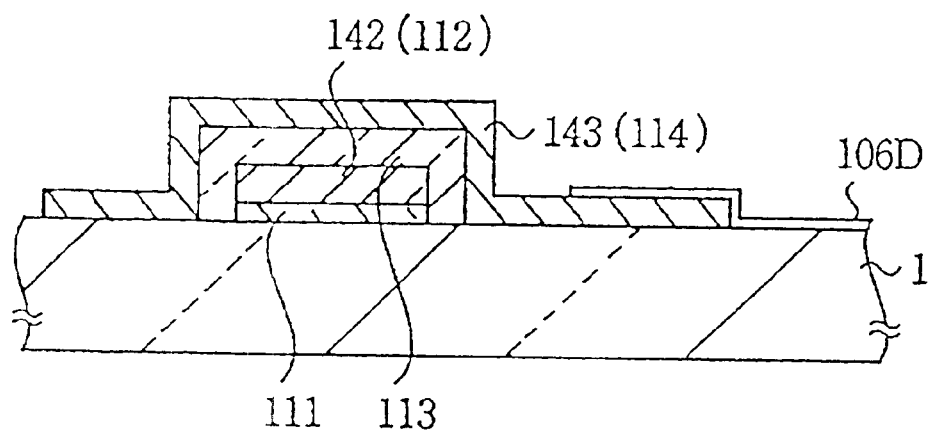

FIG. 20 is a plan view of Embodiment 11, and FIGS. 21A, 21B are cross sectional views seen at planes A—A, and B—B in FIG. 20.

The processing steps are as follows. Tantalum film 111 of about 100 nm thickness was deposited on top of a transparent glass plate 1 of thickness 0.7 mm, this was followed by a tantalum film 112 of about 300 nm thickness which was patterned to produce signals lines 102H and their branched lower electrodes 142. Next, the start terminals 102Ht were masked prior to performing anode oxidation to produce tantalum oxide film of about 200 nm thickness to form signal lines 102H and the lower electrodes 142 having a top surface and the lateral surface covered with the interlayer insulation film 113. Plasma processing was carried out in an atmosphere of nitrogen or ammonia gas to produce tantalum nitride film 115 of about 5 nm thickness on the top surface of tantalum film and lateral wall surfaces of signal line start terminals 102Ht. Next, chrome film 114 of about 150 nm thickness was deposited, and patterning was carried out to produce the upper electrodes 143. Next, ITO film of about 150 nm thickness was deposited, and patterning was carried out to produce pixel electrodes 106D. The base assembly was annealed to produce an active matrix base.

The results and properties of this base were similar to those in Embodiment 1. It is possible to eliminate the step of masking the start terminals 102Ht for performing anodic oxidation. This procedure will produce an interlayer insulation film of tantalum oxide on the top and lateral surfaces of the patterned tantalum structure. Later, this oxide layer is removed from the start terminals and their vicinity to produce contact holes. The structure can then be plasma treated in nitrogen or ammonia gas. By following such a procedure, it is possible to choose the size of the contact holes to make the structure illustrated in FIG. 21A, or the structure illustrated in FIG. 19B in which tantalum oxide film is self-aligned in the terminal contact holes. Also, the chrome film 114 may be left in the openings and their vicinity, without performing the plasma processing, for later nitriding.

What is claimed is:

1. An active matrix base comprising:

a plurality of scanning lines arranged in parallel on a transparent base plate;

a plurality of signal lines arranged in parallel at right angles to said parallel scanning lines;

switching elements fabricated at intersection points of said scanning lines with said signal lines;

pixel electrodes operatively connected with said switching elements;

and a connecting electrode fabricated upon a metal start terminal of each of said scanning lines and said signal lines;

wherein said connecting electrode comprises a metal film directly contacting said metal start terminal and a nitride film of said metal, selected from the group consisting of a high-melting-point metal and a high-electrical-conductivity metal, formed on said metal film and directly contacting an upper surface of said metal film.

2. An active matrix base according to claim 1, wherein at least said metal film of said connecting electrodes is overlayed selectively with an electrical insulation film having terminal contact holes.

3. An active matrix base according to claim 1, wherein said nitride film is overlaid on an outer surface and lateral surfaces of a structure comprised of said metal film.

4. An active matrix base according to claim 1, wherein said nitride film is overlaid on said metal film by self-aligning in said terminal contact holes.

5. An active matrix base according to claim 1, wherein said high melting point metal is selected from the group consisting of chromium, tantalum, niobium, titanium, molybdenum, and tungsten elements and an alloy comprised substantially of chromium, tantalum, niobium, titanium, molybdenum, and tungsten elements, and said metal of having a high electrical conductivity is selected from the group consisting of aluminum element and an alloy comprised substantially of aluminum element.

6. An active matrix base according to claim 1, wherein said nitride film is at least 100 nm thick.

7. An active matrix base comprising:

a plurality of signal lines arranged in parallel on a transparent base plate;

a plurality of scanning lines arranged at right angles to said parallel signal lines;

a plurality of switching elements fabricated on each of said plurality of scanning lines;

a pixel electrode operatively connected to each of said plurality of switching elements;

and a connecting electrode fabricated upon a metal start terminal of each of said scanning lines and said signal lines;

wherein said connecting electrode comprises a metal film directly contacting said metal start terminal and a nitride film of said metal, selected from the group consisting of a high-melting-point metal and a high-electrical-conductivity metal, formed on said metal film.

8. An active matrix base according to claim 7, wherein at least said metal film of said connecting electrodes is overlayed selectively with an electrical insulation film having terminal contact holes.

9. An active matrix base according to claim 7, wherein said nitride film is overlaid on an outer surface and lateral surfaces of a structure comprised of said metal film.

10. An active matrix base according to claim 7, wherein said nitride film is overlaid on said metal film by self-aligning in said terminal contact holes.

11. An active matrix base according to claim 7, wherein said high melting point metal is selected from the group consisting of chromium, tantalum, niobium, titanium, molybdenum, and tungsten elements and an alloy comprised substantially of chromium, tantalum, niobium, titanium, molybdenum, and tungsten elements, and said metal of having a high electrical conductivity is selected from the group consisting of aluminum element and an alloy comprised substantially of aluminum element.

12. An active matrix base according to claim 7, wherein said nitride film is at least 100 nm thick.

* * * * *